US008115187B2

(12) United States Patent
Segal et al.

(10) Patent No.: US 8,115,187 B2

(45) Date of Patent: Feb. 14, 2012

(54) TRIODES USING NANOFABRIC ARTICLES AND METHODS OF MAKING THE SAME

(75) Inventors: Brent M. Segal, Woburn, MA (US); Jonathan W. Ward, Fairfax, VA (US); Thomas Rueckes, Rockport, MA (US)

(73) Assignee: Nantero, Inc., Woburn, MA (US)

( * ) Notice: Subject to any disclaimer, the term of this patent is extended or adjusted under 35 U.S.C. 154(b) by 203 days.

(21) Appl. No.: 12/124,475

(22) Filed: May 21, 2008

(65) Prior Publication Data

US 2009/0115305 A1 May 7, 2009

Related U.S. Application Data

(60) Provisional application No. 60/931,227, filed on May 22, 2007.

(51) Int. Cl.
*H01L 29/02* (2006.01)

(52) U.S. Cl. ............. 257/4; 313/300; 313/293; 977/742

(58) Field of Classification Search ...... 257/4; 313/300, 313/293, 297, 497; 977/742; 445/56
See application file for complete search history.

(56) References Cited

U.S. PATENT DOCUMENTS

| | | | | |
|---|---|---|---|---|
| 4,979,149 | A | 12/1990 | Popovic et al. | |
| 5,973,444 | A * | 10/1999 | Xu et al. | 313/309 |
| 6,057,637 | A | 5/2000 | Zettl et al. | |
| 6,062,931 | A | 5/2000 | Chuang et al. | |
| 6,100,109 | A | 8/2000 | Melzner et al. | |
| 6,128,214 | A | 10/2000 | Kuekes et al. | |
| 6,250,984 | B1 * | 6/2001 | Jin et al. | 445/51 |
| 6,256,767 | B1 | 7/2001 | Kuekes et al. | |
| 6,277,318 | B1 | 8/2001 | Bower et al. | |
| 6,314,019 | B1 | 11/2001 | Kuekes et al. | |
| 6,342,276 | B1 | 1/2002 | You | |
| 6,409,567 | B1 | 6/2002 | Amey, Jr. et al. | |
| 6,420,726 | B2 | 7/2002 | Choi et al. | |

(Continued)

FOREIGN PATENT DOCUMENTS

GB 2 364 933 A 2/2002

(Continued)

OTHER PUBLICATIONS

Derycke, V., et al., "Carbon Nanotube Inter- and Intramolecular Logic Gates," *Nano Letters*, Sep. 2001, vol. 1, No. 9, pp. 453-456.

(Continued)

*Primary Examiner* — Jenny L Wagner
*Assistant Examiner* — Jami M Valentine

(57) ABSTRACT

Vacuum microelectronic devices with carbon nanotube films, layers, ribbons and fabrics are provided. The present invention discloses microelectronic vacuum devices including triode structures that include three-terminals (an emitter, a grid and an anode), and also higher-order devices such as tetrodes and pentodes, all of which use carbon nanotubes to form various components of the devices. In certain embodiments, patterned portions of nanotube fabric may be used as grid/gate components, conductive traces, etc. Nanotube fabrics may be suspended or conformally disposed. In certain embodiments, methods for stiffening a nanotube fabric layer are used. Various methods for applying, selectively removing (e.g. etching), suspending, and stiffening vertically- and horizontally-disposed nanotube fabrics are disclosed, as are CMOS-compatible fabrication methods. In certain embodiments, nanotube fabric triodes provide high-speed, small-scale, low-power devices that can be employed in radiation-intensive applications.

27 Claims, 36 Drawing Sheets

U.S. PATENT DOCUMENTS

| | | | | |
|---|---|---|---|---|
| 6,423,583 | B1 | 7/2002 | Avouris et al. | |
| 6,426,687 | B1 | 7/2002 | Osborn | |
| 6,443,901 | B1 | 9/2002 | Fraser | |
| 6,445,006 | B1 | 9/2002 | Brandes et al. | |
| 6,495,116 | B1 | 12/2002 | Herman | |
| 6,495,258 | B1 | 12/2002 | Chen et al. | |
| 6,515,339 | B2 | 2/2003 | Shin et al. | |
| 6,528,020 | B1 | 3/2003 | Dai et al. | |
| 6,548,841 | B2 | 4/2003 | Frazier et al. | |
| 6,630,772 | B1 | 10/2003 | Bower et al. | |
| 6,645,628 | B2 | 11/2003 | Shiffler, Jr. et al. | |
| 6,706,402 | B2 | 3/2004 | Rueckes et al. | |
| 6,707,098 | B2 | 3/2004 | Hofmann et al. | |
| 6,759,693 | B2 | 7/2004 | Vogeli et al. | |
| 6,803,840 | B2 | 10/2004 | Hunt et al. | |
| 6,808,746 | B1 | 10/2004 | Dai et al. | |
| 6,809,462 | B2 | 10/2004 | Pelrine et al. | |
| 6,809,465 | B2 | 10/2004 | Jin | |
| 6,833,558 | B2 | 12/2004 | Lee et al. | |
| 6,858,197 | B1 | 2/2005 | Delzeit | |
| 6,863,942 | B2 | 3/2005 | Ren et al. | |
| 6,899,945 | B2 | 5/2005 | Smalley et al. | |
| 6,918,284 | B2 | 7/2005 | Snow et al. | |
| 6,919,592 | B2 | 7/2005 | Segal et al. | |
| 6,919,740 | B2 | 7/2005 | Snider | |
| 6,921,575 | B2 | 7/2005 | Horiuchi et al. | |
| 6,924,538 | B2 | 8/2005 | Jaiprakash et al. | |
| 6,946,410 | B2 | 9/2005 | French et al. | |
| 6,955,937 | B1 | 10/2005 | Burke et al. | |
| 6,969,651 | B1 | 11/2005 | Lu et al. | |
| 6,990,009 | B2 | 1/2006 | Bertin et al. | |
| 7,015,500 | B2 | 3/2006 | Choi et al. | |
| 7,057,402 | B2 | 6/2006 | Cole et al. | |
| 7,115,901 | B2 | 10/2006 | Bertin et al. | |
| 7,115,960 | B2 | 10/2006 | Bertin et al. | |
| 7,161,403 | B2 | 1/2007 | Bertin | |
| 2001/0004979 | A1 | 6/2001 | Han et al. | |
| 2001/0023986 | A1 | 9/2001 | Mancevski | |
| 2002/0153583 | A1 | 10/2002 | Frazier et al. | |
| 2002/0160111 | A1 | 10/2002 | Sun et al. | |
| 2002/0175390 | A1 | 11/2002 | Goldstein et al. | |
| 2003/0004058 | A1 | 1/2003 | Li et al. | |
| 2003/0122111 | A1 | 7/2003 | Glatkowski | |
| 2003/0158474 | A1* | 8/2003 | Scherer et al. | 600/409 |
| 2003/0177450 | A1 | 9/2003 | Nugent | |
| 2003/0200521 | A1 | 10/2003 | DeHon et al. | |
| 2004/0005723 | A1 | 1/2004 | Empedocles et al. | |
| 2004/0007528 | A1 | 1/2004 | Bakajin et al. | |
| 2004/0023253 | A1 | 2/2004 | Kunwar et al. | |
| 2004/0031975 | A1 | 2/2004 | Kern et al. | |
| 2004/0067602 | A1* | 4/2004 | Jin | 438/22 |
| 2004/0071949 | A1 | 4/2004 | Glatkowski et al. | |
| 2004/0099438 | A1 | 5/2004 | Arthur et al. | |
| 2004/0104129 | A1 | 6/2004 | Gu et al. | |
| 2004/0181630 | A1 | 9/2004 | Jaiprakash et al. | |
| 2004/0238907 | A1 | 12/2004 | Pinkerton et al. | |
| 2004/0253167 | A1 | 12/2004 | Silva et al. | |
| 2004/0265550 | A1 | 12/2004 | Glatkowski et al. | |
| 2005/0053525 | A1 | 3/2005 | Segal et al. | |
| 2005/0056877 | A1 | 3/2005 | Rueckes et al. | |
| 2005/0065741 | A1 | 3/2005 | Segal et al. | |
| 2005/0068128 | A1 | 3/2005 | Yip | |
| 2005/0095938 | A1* | 5/2005 | Rosenberger et al. | 442/194 |
| 2005/0275331 | A1 | 12/2005 | Takai et al. | |
| 2006/0183278 | A1 | 8/2006 | Bertin et al. | |
| 2006/0237537 | A1 | 10/2006 | Empedocles et al. | |
| 2006/0237799 | A1 | 10/2006 | Lu et al. | |
| 2006/0278902 | A1 | 12/2006 | Sun et al. | |
| 2007/0004191 | A1 | 1/2007 | Gu et al. | |
| 2008/0018228 | A1* | 1/2008 | Choi et al. | 313/497 |
| 2008/0299307 | A1 | 12/2008 | Ward | |

FOREIGN PATENT DOCUMENTS

| | | | |
|---|---|---|---|
| JP | 2000-203821 | | 7/2000 |
| JP | 2001-035362 | | 2/2001 |
| JP | 2004-090208 | | 3/2004 |
| WO | WO-98/39250 | A1 | 9/1998 |
| WO | WO-99/65821 | A1 | 12/1999 |
| WO | WO-00/48195 | | 8/2000 |
| WO | WO-01/03208 | A1 | 1/2001 |
| WO | WO-02/45113 | A1 | 6/2002 |
| WO | WO-02/48701 | A2 | 6/2002 |
| WO | WO-03/016901 | | 2/2003 |
| WO | WO-03/034142 | A1 | 4/2003 |
| WO | WO-2009/005908 | | 1/2009 |

OTHER PUBLICATIONS

Duan, X. et al., "Nonvolatile Memory and Programmable Logic from Molecule-Gated Nanowires", *Nano Letters*, vol. 0, No. 0, pp. A-D, 2002.

Heinze, S. et al., "Carbon Nanotubes as Schottky Barrier Transistsors", *Physical Review Letters*, vol. 89, No. 10, pp. 16801-1-106801-4, 2002.

Javey, A., et al., "Carbon Nanotube Transistor Arrays for Multistage Complementary Logic and Ring Oscillators," *Nano Letters*, 2002, vol. 2 , No. 9, pp. 929-932.

Kinaret, J. M. et al "A Carbon-nanotube-based nanorelay," *Applied Physics Letters*, Feb. 24, 2003, vol. 82, No. 8, pp. 1287-1289.

Luyken, R. J. et al., "Concepts for hybrid CMOS-molecular non-volatile memories", *Nanotechnology*, vol. 14, pp. 273-276, 2003.

Martel, R., et al, "Carbon Nanotube Field-Effect Transistors and Logic Circuits," *DAC 2002*, Jun. 10-12, 2002, vol. 7.4, pp. 94-98.

Onoa, G.B. et al., "Bulk production of singly dispersed carbon nanotubes with prescribed lengths," Nanotechnology, vol. 16, pp. 2799-2803, 2005.

Wind, S. J. et al., "Fabrication and Electrical Characterization of Top Gate Single-Wall Carbon Nanotube Field-Effect Transistors", IBM T.J. Watson Research Center, 2002, 14 pages.

Ago, Hiroki et al. "Workfunction of Purified and Oxidsed Carbon Nanotubes," Synthethic Metals 103, pp. 2494-2495, 1999.

Ajayan, P.I M.et al., "Applications of Carbon Nanotubes." Topics in Applied Physics, vol. 80, pp. 391-425, 2001.

Avouris, Ph., "Carbon nanotube electronics", *Chem. Physics*, 2002, vol. 281, pp. 429-445.

Banerjee, Sarbajit and Stanislaus S. Wong. "Functionalization of Carbon Nanotubes with a Metal-Containing Molecular Complex." Nano Letters, vol. 2, No. 1, pp. 49-53, 2002.

Bonard, J. et al., "Monodisperse Multiwall Carbon Nanotubes Obtained with Ferritin as Catalyst," Nano Letters, 2002, vol. 2, No. 6, 665-667.

Cassell, Alan M. et al. "Large Scale CVD Synthesis of Single-Walled Carbon Nanotubes." American Chemical Society, pp. 6484-6492, 1999.

Chen, B., et al., "Heterogeneous Single-Walled Carbon Nanotube Catalyst Discovery and Optimization." Chem. Mater., vol. 14, pp. 1891-1896, 2002.

Cheng, H. M. et al. "Large-scale and low-cost synthesis of single-walled carbon nanotubes by the catalyst pyrolysis of hydrocarbons", Applied Physics Letters, vol. 72, No. 25, pp. 3282-3284, Jun. 22, 1998.

Chiang, I.W., "Purification and Characterization of Single-Wall Carbon Nanotubes," J. Phys. Chem. B 2001, vol. 105, pp. 1157-1161.

Dai, Hongjie. "Controlled Chemical Routes to Nanotube Architectures, Physics, and Devices." The Journal of Physical Chemistry B (1999); 103: 11246-11255.

Delzeit, L., et al., "Multilayered Metal Catalysts for Controlling the Density of Single-walled Carbon Nanotube Growth." Chemical Physics Letters, 348, 368-374, Nov. 16, 2001.

Desai et al., "Freestanding Carbon Nanotube Specific Fabrication," Proc. of 2005 5th IEEE Conf., Nanotech., Nagoya, Japan, pp. 1-4, Jul. 2005.

Franklin, N. R. et al, "An Enhanced CVD Approach to Extensive Nanotube Networks with Directionality", Advanced Materials, pp. 890-894, 2002.

Hafner, Jason H. et al. "Catalytic growth of single-wall carbon nanotubes from metal particles," Chemical Physics Letters, vol. 296, pp. 195-202, Oct. 30, 1998.

Homma, Y., "Single-Walled Carbon Nanotube Growth on Silicon Substrates Using Nanoparticle Catalysts", Jpn. J. Appl. Phys., vol. 41, pp. L89-L91, Jan. 15, 2002.

Joselevich, Ernesto, "Vectorial Growth of Metallic and Semiconducting Single-Wall Carbon Nanotubes," Nano Letters, xxxx, vol. 0, pp. A-E, 5 pages.
Kong, Jing, "Chemical vapor deposition of methane for single-walled carbon nanotubes," Chemical Physics Letters, vol. 292, Nos. 4-6, pp. 567-574, Aug. 14, 1998.
Li, Y. et al., "Preparation of Monodispersed Fe-Mo Nanoparticles as the Catalyst for CVD Synthesis of Carbon Nanotubes", Chem. Mater., vol. 12, p. 1008=1-14, 2001.
Li, Yiming et al. "Growth of Single-Walled Carbon Nanotubes from Discrete Catalytic Nanoparticles of Various Sizes", J. Phys. Chem. B 2001, 105, pp. 11424-11431, 2001.
Nerushev, O. A. et al. "Carbon nanotube films obtained by thermal chemical vapor deposition", Journal of Chemistry Materials, vol. 11, pp. 1122-1132, 2001.
Peigney, A. et al. "A Study of the Formation of Single- and Double-Walled Carbon Nanotubes by a CVD Method", Journal of Physical Chemistry B, vol. 105, pp. 9699-9710, 2001.
Radosavljevic, M. et al, "Nonvolatile molecular memory elements based on ambipolar nanotube field effect transistors," *Nano Letters*, Jun. 1, 2002, vol. 2, No. 7, pp. 761-764.
Zhang, Y. et al., "Formation of metal nanowires on suspended single-walled carbon nanotubes," *Appl. Phys. Lett.*, vol. 77, No. 19 p. 3015-3017, Nov. 2000.
Zhang, S. et al., "Select Pathways to Carbon Nanotube Film Growth", Advanced Materials, vol. 13, pp. 1767-1770, Dec. 3, 2001.
Zhang, Y. et al., "Metal coating on suspended carbon nanotubes and its implication to metal-tube interaction", Chemical Physics Letters pp. 35-41, Nov. 24, 2000.
Zhao, Y. P. et al., "Frequency-dependent electrical transport in carbon nanotubes", Physical Review B, vol. 64, 201402(4), 2001.
Parikh, K. et al., "Flexible vapour sensors using single walled carbon nanotubes", Sensors and Actuators B, vol. 113, pp. 55-63, 2006.
Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.
Sotiropoulou, S. et al., "Carbon nanotube array-based biosensor", Anal Bioanal Chem, vol. 375, pp. 103-105, 2003.
Valentini, L. et al., "Sensors for sub-ppm $NO_2$ gas detection based on carbon nanotube thin films", Applied Physics Letters, vol. 82, No. 6, pp. 961-963, Feb. 10, 2003.
Haddon, R.C., et al., "Purification and Separation of Carbon Nanotubes" MRS Bulletin (2004) 252-259, Apr. 2004.
Jeong, Tak, et al., "A new purification method of single-wall carbon nanotubes using H2S and O2 mixture gas" Chemical Physics Letters (2001) 344: 18-22.
Kahn, Michael G. C., et al., "Solubilization of Oxidized Single-Walled Carbon Nanotubes in Organic and Aqueous Solvents through Organic Derivation" (2002) 2(11) 1215-1218.
Shelimov, Konstantin B., et al., "Purification of single-wall carbon nanotubes by ultrasonically assisted filtration" Chemical Physics Letters (1998) 282: 429-434.
Berhan, L., "Mechanical Properties of Nanotube Sheets: Alterations in Joint Morphology and Achievable Moduli in Manufacturable Materials," Journal of Applied Physics, vol. 95, No. 8, Apr. 15, 2004, pp. 4335-4345.
Li, J. et al., "Carbon Nanotube Nanoelectrode Array for Ultrasensitive DNA Detection," American Chemical Journal, vol. 3, No. 5, 2003, pp. 597-602.
Kong, J., et al., "Nanotube Molecular Wires as Chemical Sensors," Science, vol. 287, pp. 622-625, Jan. 28, 2000.
Niu, Chunming et al., "High Power Electrochemical Capacitors Based on Carbon Nanotube Electrodes," Appl. Phys. Lett. 70, Mar. 17, 1997, pp. 1480-1482.
Bachtold, A., et al, "Logic Circuits Based on Carbon Nanotubes," Physica (2003) pp. 42-46.
Bradley, K. et al., "Flexible Nanotube Electronics," Nano Letters 2003, vol. 3, No. 10, 1353-1355.
Chen, J., et al, "Self-aligned Carbon Nanotube Transistors with Charge Transfer Doping," Applied Physics Letters (2005) 86:123108-1-3.
Chen, J., et al, "Self-aligned Carbon Nanotube Transistors with Novel Chemicsl Doping," IEDM (2004) 04:695-698.
Dequesnes, et al., "Calculation of pull-in voltages for carbon-nanotube-based nanoelectromechanical switches," Nanotechnology 13, 2002, pp. 120-131, 12 pages.
Derycke, V., "Controlling Doping and Carrier Injection in Carbon NanotubeTransistors", Applied Physics Letters, 2002. 80 (15) 2773-2775.
Huang, Y., et al, "Logic Gates and Computation from Assembled Nanowire Building Blocks," Science (2001) 294(9):1313-1317.
Javey, A., et al, "Carbon Nanotube Field-Effect Transistors with Integrated Ohmic Contacts and High-κ Gate Dielectrics," Nano Letters (2004) 4(3): 447-450.
Javey, A., et al, "High-κ Dielectrics for Advanced Carbon-Nanotube Transistors and Logic Gates," Nature Materials (2002) 1:241-246.
Kaneto, K. et al., "Electrical conductivities of multi-wall carbon nano tubes," Synthetic Metals, Elsevier Science S.A. (1999), vol. 103, pp. 2543-2546.
Lin, Y., et al, "Novel Carbon Nanotube FET Design with Tunable Polarity," IEDM (2004) 4:687-690.
Rueckes, et al., "Carbon nanotube-based nonvolatile random access memory for molecular computing", *Science*, vol. 289, pp. 94-97, Jul. 7, 2000.
Stadermann, M. et al., "Nanoscale study of conduction through carbon nanotube networks," *Phys. Rev. B 69* , 201402(R), 2004.
Wind, S., et al, "Vertical Scaling of Carbon Nanotube Field-Effect Transistors Using Top Gate Electrodes," Applied Physics Letters (2002), 80(20):3817-3819.
International Search Report and Written Opinion of the International Searching Authority, the United States Patent and Trademark Office, for International Application No. PCT/US2008/064385, dated Dec. 3, 2008, 8 pages.

* cited by examiner

Figure 3(I')
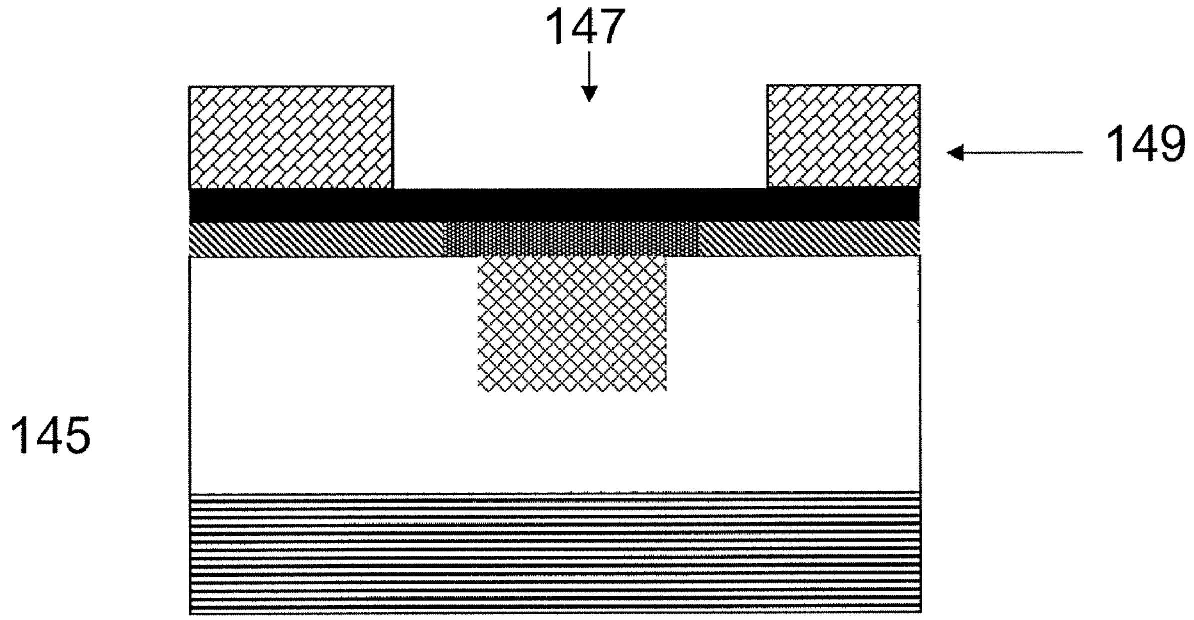

Figure 3(J')
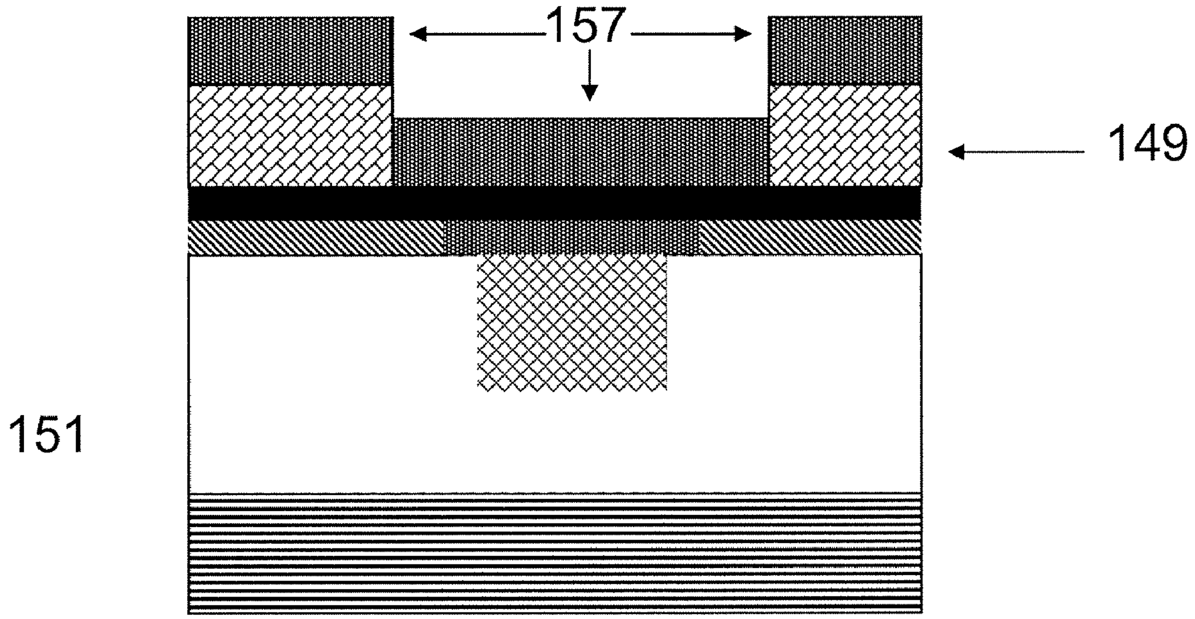

184

1300

TRIODES USING NANOFABRIC ARTICLES AND METHODS OF MAKING THE SAME

CROSS-REFERENCE TO RELATED APPLICATIONS

This application claims priority under 35 U.S.C. §119(e) to U.S. Provisional Patent Application No. 60/931,227, entitled "Triodes Using Nanofabric Articles and Methods of Making the Same," filed May 22, 2007.

This application is related to the following applications which are assigned to the assignee of this application, and are hereby incorporated by reference in their entirety:

U.S. Pat. No. 6,919,592, entitled Electromechanical Memory Array Using Nanotube Ribbons and Method for Making Same, filed on Jul. 25, 2001 [NAN1];

U.S. Pat. No. 6,911,682, entitled Electromechanical Three-Trace Junction Devices, filed on Dec. 28, 2001 [NAN4];

U.S. Pat. No. 6,706,402, entitled Nanotube Films and Articles, filed Apr. 23, 2002 [NAN6];

U.S. patent application Ser. No. 10/341,005, entitled Methods of Making Carbon Nanotube Films, Layers, Fabrics, Ribbons, Elements and Articles, filed on Jan. 13, 2003 [NAN15]; and U.S. Pat. No. 6,924,538, entitled Electro-Mechanical Switches and Memory Cells Using Vertically-Disposed Nanofabric Articles and Methods of Making the Same, filed on Feb. 11, 2004 [NAN20].

BACKGROUND

1. Technical Field

The present application generally relates to vacuum microelectronic and nanoelectronic devices and methods of making the same.

2. Discussion of Related Prior Art

Vacuum tube and integrated circuit devices and their fabrication have been well-known for many years. Recently, techniques originally used for fabrication of integrated circuit devices and hybrid devices comprising carbon nanotube based electronic elements have been applied to make nanoscale devices. Such electronic devices offer several advantages over traditional integrated circuit devices. Vacuum is an ideal electron transport medium where electrons travel at high speeds compared to high mobility semiconductor solids such as GaAs and SiC. These high speeds increase the device's switching speed. Moreover, in vacuum devices, there is no heat produced during electron transportation as in traditional integrated circuits. This is because in vacuum devices, there is no scattering medium to impede electron transport. An additional advantage of vacuum microelectronic devices is that they are relatively insensitive to temperature and radiation compared to traditional integrated circuit devices. Since no active junction regions exist, there is no associated parasitic capacitance and the semiconductor medium used for processing vacuum nanoelectronic devices does not need to be as of high a quality as used in traditional integrated circuit devices. Because processing steps are simplified, manufacturing costs for vacuum microelectronic devices is decreased.

The triode is a three-terminal device comprising a cathode, a grid, and a plate and can be used as an amplifier for electronic or audio signals. A triode (or 3-terminal vacuum tube) operates by heating a cathode electrode so that electrons are emitted by Fowler-Nordheim tunneling. Electrons are directed toward an anode plate by a high electric field. The electrons can be modulated by applying a voltage on the grid structure. The advent of the vacuum tube triodes accelerated the development of computers. Electronic tubes were used in several different computer designs in the late 1940's and early 1950's. But the limits of these tubes were soon reached. As the electric circuits became more complicated, one needed more and more triodes. Engineers packed several triodes into one vacuum tube to make the tube circuits more efficient.

As stated above, the electron pathway in a tube triode is through a vacuum. A triode grid can control current through the vacuum, analogously to the way a gate controls current through the solid-material channel of a field effect transistor. The high velocity of electrons through a vacuum allows for a triode to be a useful high-frequency device. Because of problems inherent in these tube devices, modem integrated circuits have surpassed and replaced vacuum tube technology for fabrication of computer and electronic systems. The problems include: leakage, the metal that emitted electrons in the vacuum tubes burned out, the requirement of large thermal powers for electron emission and large circuits took too much energy to run, etc. Early computers were built with over 10,000 vacuum tubes and occupied huge amounts of space. In order to overcome problems of the vacuum tubes, scientists began to consider how one might control electrons in solid materials, like metals and semiconductors. Transistors, such as field effect transistors and metal oxide field effect transistors took the place of the bulky conventional vacuum tube-based amplifiers and switches (triodes). Transistors were later integrated into circuit boards, and made from the same materials and in the same procedures as other electronic elements on those circuit boards.

However, even with current high-speed semiconductor technology, power amplification is still a problem for the gigahertz frequencies. Large numbers of transistors with complex circuitry and thermal management schemes are required to generate the high power and high frequencies for applications such as space-based applications, radar, wireless communications and electronic warfare. Such disadvantages associated with solid-state semiconductor technology make vacuum tube technology appealing, since vacuum tubes have large electron speeds with much smaller power requirements. Another advantage of vacuum tube technology is that it is inherently radiation hard, whereas semiconductor charge-storage mediums are not and need to be radiation hardened by costly and complex fabrication techniques. Therefore, the ability to fabricate triodes and other vacuum technologies with technologies and integrated circuit fabrication techniques may allow for the production of high speed and low power devices that can be employed for radiation intensive devices such as radar, wireless communications, electronic warfare and any space based electronics.

Integrated triodes have been described; see e.g. Garner, D. M., Long, G. M., Herbison, D., Amaratunga, G. A. J. Field-emission triode with integrated anodes. *Journal of Vacuum Science and Technology B, Microelectronics and Nanometer Structures*, 18, (2), 914-918 (March/April 2000). The operating voltage described is relatively large. To date, the fabrication of a triode (amplifier) using relatively low, useful voltages has not been feasible in integrated circuitry.

Bower et al. have described a micro triode using carbon nanotubes as field emitters. See "On-Chip Vacuum Microtriode Using Carbon Nanotube Field Emitters", Applied Physics Letters, Vol 80, No. 20, (2002) 3820-3822 and "A micromachined vacuum triode using a carbon nanotube cold cathode", IEEE Transactions on Electron Devices, Vol. 4, No. 8, (2002), 1478-1483. Bower employs multi-walled nanotubes (MWNTs) as a cold cathode for electron emission in the triode device. Because the triode devices described in Bower utilize large feature sizes greater than 20 microns to >100 microns and a method that typically produces highly defective and varying quality of MWNTs at high temperatures (not CMOS compatible), the voltages necessary for field emission are >100 volts, still much higher than feasible for integrated circuit applications. There is therefore a need in the art for triodes of smaller feature size which require smaller voltages for electron emission.

The large feature sizes employed by others to fabricate the micro-machined vacuum tubes has limited them to 3-terminals. Fabricating higher order vacuum tubes such as tetrodes and pentodes is also not feasible with their designs and processes.

Carbon nanotubes have been found to be excellent conductors or semiconductors, depending on the chirality of a given tube, and Ward et al. have described films of nanotubes which may comprise composites of both conducting and semiconducting nanotubes or only single types of nanotubes. Nanotube films are more fully described in U.S. patent application Ser. No. 10/341,005, entitled Methods of Making Carbon Nanotube Films, Layers, Fabrics, Ribbons, Elements and Articles, the entire contents of which are herein incorporated in their entirety. Such films may be patterned into ribbons or traces and may act as electrical connections between elements.

The inventors envision the utilization of a carbon nanotube fabric as a grid structure to control the current flow between cathode and anode of a triode and of a tetrode and pentode.

SUMMARY OF THE INVENTION

The present invention describes carbon nanotube-based vacuum tubes, specifically triodes, but including higher order vacuum tubes such as tetrodes and pentodes. Carbon nanotube films, layers and fabrics may be used as the gate structure for triode and other vacuum devices. The present invention further provides devices with improved performance, reduced size, and/or which may be fabricated more simply with CMOS integration steps than comparable devices found in the current art.

Under one embodiment of the invention, a multi-terminal vacuum field emission device includes two substrates disposed at a predetermined gap and which define a space therebetween. Spacers are positioned between the two substrates to vacuum seal the space formed by the two substrates while maintaining the gap. A top electrode and a bottom electrode are arranged in proximity to the two substrates, the top electrode comprising an electron emission source. A gate region of nanotube fabric is disposed between the top electrode and the bottom electrode and a gate terminal in electrical communication with the nanotube fabric. In response to an electrical stimulus on the gate terminal, the gate region of nanotube fabric induces emission of electrons from the electron emission source to form an electrically conductive pathway between the top and bottom electrodes.

According to one aspect of the invention the device comprises a triode, the top electrode comprises a collector, and the bottom region comprises an emitter.

According to another aspect of the invention, a second patterned region of nanotube fabric is disposed in a plane substantially parallel to and in spaced relation to the gate region of nanotube fabric. The second patterned region is disposed between the top and bottom electrodes and in electrical communication with a corresponding terminal to receive electrical stimulus.

According to another aspect of the invention, the device comprises a tetrode.

According to another aspect of the invention, a third patterned region of nanotube fabric is disposed in a plane substantially parallel to and in space relation to the gate region of nanotube fabric. The third patterned region is disposed between the top and bottom electrodes and in electrical communication with a corresponding terminal to receive electrical stimulus.

According to another aspect of the invention, the device comprises a pentode.

According to another aspect of the invention, the device is integrated in a CMOS circuit.

According to another aspect of the invention, the electrical stimulus comprises a relatively small voltage signal and the controllable electrically conductive pathway is sensitive to the relatively small electrical voltage signal.

According to another aspect of the invention, the nanotube fabric includes a mesh grid structure.

According to another aspect of the invention, the nanotube fabric includes a substantially porous layer.

According to another aspect of the invention, the nanotube fabric includes a plurality of unaligned nanotubes forming a network of conductive pathways.

According to another aspect of the invention, the plurality of nanotubes includes metallic nanotubes.

According to another aspect of the invention, at least some of the nanotube are partially coated with a stiffening agent.

According to another aspect of the invention, the stiffening agent includes a dielectric such that the mechanical characteristics of the nanotube fabric are substantially affected by the stiffening agent and such that the electrical characteristics of the nanotube fabric are substantially unaffected by the stiffening agent.

According to another aspect of the invention, the nanotube fabric is at least partially coated with a silicon-based material.

According to another aspect of the invention, the nanotube fabric is at least partially coated with a metal.

According to another aspect of the invention, the unaligned nanotubes substantially form a monolayer.

According to another aspect of the invention, the unaligned nanotubes form a multi-layered fabric.

According to another aspect of the invention, the bottom electrode includes a layer of nanotube fabric.

According to another aspect of the invention, the top electrode includes a layer of nanotube fabric.

According to another aspect of the invention, the bottom electrode and the top electrode each includes a metal.

According to another aspect of the invention, the patterned region of nanotube fabric is selectively deformed from a planar orientation to alter a capacitance state between the top electrode and the bottom electrode.

According to another aspect of the invention, the bottom electrode includes a layer of nanotube fabric and is arranged along a plane substantially parallel to the plane of the grid.

According to another aspect of the invention, the bottom electrode is suspended in spaced relation to a surface of the two substrates.

According to another aspect of the invention, the bottom electrode is substantially mechanically deformed to alter a capacitance value between the gate region and the bottom electrode.

According to another aspect of the invention, the bottom electrode is conformally disposed on one surface of the two substrates.

According to another aspect of the invention, the top electrode is conformally disposed on one surface of the two substrates.

Under another embodiment of the invention, a method of making a multi-terminal vacuum field emission device includes providing two substrates at a predetermined gap and spacers to maintain the gap between the two substrates and vacuum sealing the gap. A top electrode and a bottom electrode are provided and arranged in proximity to the two substrates, the bottom electrode comprising an electron emission source. A layer of nanotube fabric is suspended between the top electrode and the bottom electrode to form a gate and a gate terminal in electrical communication with the layer of nanotube fabric is provided. In response to an electrical stimulus on the gate terminal, the layer of nanotube fabric induces emission of electrons from the electron emission source to form an electrically conductive pathway between the top and bottom electrodes.

According to another aspect of the invention, suspending a layer of nanotube fabric to form a gate includes at least partially coating the nanotube fabric with a metal.

According to another aspect of the invention, suspending a layer of nanotube fabric to form a gate includes at least partially coating the nanotube fabric with a dielectric.

According to another aspect of the invention, coating the nanotube fabric with the dielectric mechanically stiffens the fabric without substantially altering the electrical characteristics of the gate.

According to another aspect of the invention, suspending a layer of nanotube fabric to form a gate includes at least partially coating the nanotube fabric with a silicon-based material.

According to another aspect of the invention, providing the bottom electrode includes suspending the bottom electrode in spaced relation to one of the two substrates.

According to another aspect of the invention, providing the bottom electrode comprises depositing a layer of nanotube fabric substantially conformal to a surface of one of the two substrates.

According to another aspect of the invention, suspending the layer of nanotube fabric to form a gate includes providing a plurality of unaligned nanotubes to form a plurality of conductive pathways along the layer of nanotube fabric.

According to another aspect of the invention, suspending the layer of nanotube fabric to form a gate includes exposing the nanotube fabric to one of electromagnetic radiation and ion bombardment.

According to another aspect of the invention, exposing the nanotube fabric substantially bonds at least a first and a second intersecting nanotubes of the plurality of unaligned nanotubes to increase the mechanical rigidity of the layer of nanotube fabric.

According to another aspect of the invention, increasing the mechanical rigidity includes forming a suspended layer of nanotube fabric that remains substantially un-deformed in the presence of a strong electric field.

According to another aspect of the invention, the multi-terminal vacuum field emission device may be integrated in a CMOS circuit.

BRIEF DESCRIPTION OF THE DRAWINGS

FIGS. 12A-L illustrate steps in the fabrication of a vertically disposed triode device using a conformal nanotube fabric, according to certain aspects of the invention.

DETAILED DESCRIPTION

Figure 1:
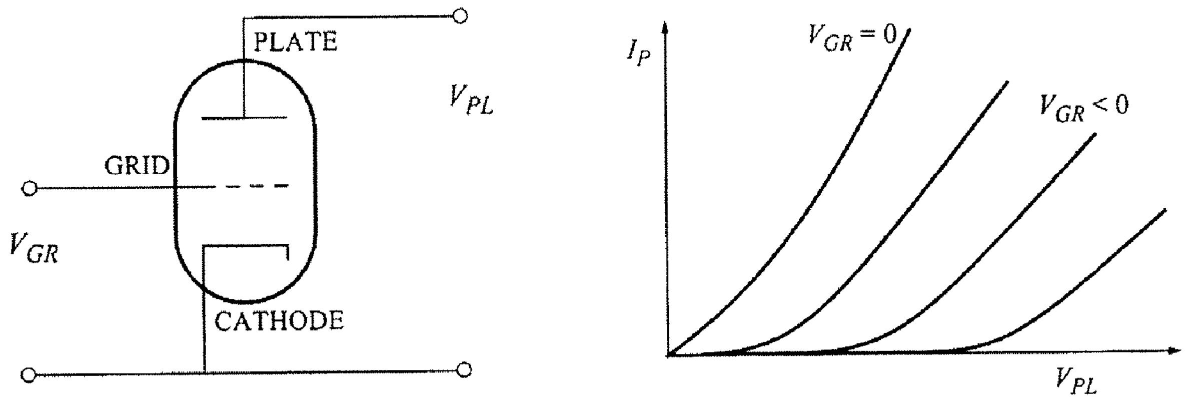
FIG. 1 illustrates a schematic of a conventional triode device and typical IV-curves for a conventional triode device.

The present application generally relates to the utilization of carbon nanotube films, layers and fabrics in triodes and other related vacuum microelectronic and nanoelectronic devices and methods of making the same. More specifically, the present application relates to vacuum microelectronic and nanoelectronic devices and methods of manufacturing same using standard semiconductor processing techniques. The present application describes carbon nanotube-based vacuum tube devices, specifically triodes, but also higher-order vacuum tube devices including tetrodes and pentodes. In various embodiments, nanoscale triodes which use voltages of about an order of magnitude smaller, or even less than those voltages needed by the microtriodes of the current art are provided.

The many limitations of earlier triode designs point to the desirability of a CMOS compatible nanoscale vacuum-type structure that leverages the many advantages of carbon nanotube technology. CMOS compatible nanoscale devices that incorporate nanotubes for various applications in the triode structure demonstrates a major improvement that is not feasible with Bower's concept (Bower et al. "On-Chip Vacuum Microtriode Using Carbon Nanotube Field Emitters", Applied Physics Letters, Vol 80, No. 20, (2002) 3820-3822 and "A micromachined vacuum triode using a carbon nanotube cold cathode", IEEE Transactions on Electron Devices, Vol. 4, No. 8, (2002), 1478-1483). For example, the CMOS-compatible nanoscale triodes using nanotubes have the advantage of lowering the required anode and grid voltages, There exists, a need for triodes comprising cathode, grid and collector having a vacuum electron path, which is able to be integrated in a CMOS process using relatively low operating voltages. There is also a need in the art for smaller-scale triode grids.

A typical nanotube device is composed of a nanofabric as described in U.S. Pat. No. 6,919,592, entitled Electromechanical Memory Array Using Nanotube Ribbons and Method for Making Same, filed Jul. 25, 2001; U.S. Pat. No. 6,643,165, entitled Electromechanical Memory Having Cell Selection Circuitry Constructed with Nanotube Technology, filed Jul. 25, 2001; U.S. Pat. No. 6,574,130, entitled Hybrid Circuit Having Nanotube Electromechanical Memory, filed Jul. 25, 2001; U.S. Pat. No. 6,911,682, entitled Electromechanical Three-Trace Junction Devices, filed Dec. 28, 2001; U.S. Pat. No. 6,784,028, Methods of Making Electromechanical Three-Trace Junction Devices, filed Dec. 28, 2001; U.S. Pat. No. 6,706,402, entitled Nanotube Films and Articles, filed Apr. 23, 2002; U.S. Pat. No. 6,835,591 entitled Methods Of Nanotube Films And Articles, filed Apr. 23, 2002; U.S. patent application Ser. No. 10/341,005, entitled, Methods Of Making Carbon Nanotube Films, Layers, Fabrics, Ribbons, Elements And Articles, filed Jan. 13, 2003; U.S. patent application Ser. No. 10/341,055, entitled Methods Of Using Thin Metal Layers To Make Carbon Nanotube Films, Layers, Fabrics, Ribbons, Elements And Articles, filed Jan. 13, 2003; U.S. patent application Ser. No. 10/341,054, entitled Methods Of Using Pre-Formed Nanotubes To Make Carbon Nanotube Films, Layers, Fabrics, Ribbons, Elements And Articles, filed Jan. 13, 2003; and U.S. patent application Ser. No. 10/341,130, entitled Carbon Nanotube Films, Layers, Fabrics, Ribbons, Elements And Articles, filed Jan. 13, 2003. The aforementioned applications are herein incorporated by reference in their entirety.

The technique chosen for processing a nanotube fabric will vary, depending on the embodiment. Typically the fabrication process will create a sufficient quantity of nanotubes in contact with other nanotubes to form a matted fabric, as a result of the nanotubes' adhesion characteristics. Details concerning matted nanotube fabrics are provided in the incorporated references. Certain embodiments (e.g., memory cells) benefit when the nanofabric is very thin (e.g., less than 2 nm). Typically, this entails a nanofabric that is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). Still some embodiments may benefit from a membrane nanotube structure whereby individual nanotubes in a nanotube fabric are bonded or welded together when bombarded with ions or electromagnetic radiation. In each such instance, the nanofabric may be patterned using photolithographic techniques generating an electrically conductive trace of nanotubes.

The disclosed vacuum microelectronic device utilizes these nanotube fabrics to provide an improved device. Besides improved performance, the devices which have reduced size, and/or may be fabricated more simply with CMOS integration techniques. The device has a triode structure which includes an emitter, a grid and an anode. An advantage of the present nanotube triode, smaller than the alternatives structures, is that it can be embedded during typical CMOS processes. Due to the small size of the present nanotube tridodes, significantly lower corresponding operating voltages may be used as compared to conventional triodes.

In various embodiments, nanotube films, layers, or non-woven fabrics may be used to form, or may be made to form, various useful patterned triode components. (Hereinafter "films," "layers," "membranes." or "non-woven fabrics" are referred to as "fabrics" or "nanofabrics".) The components created from the nanofabrics retain desirable physical properties of the nanotubes and/or the nanofabrics from which they are formed. However, in certain instances, the fabric used as grid/gate in a triode may be stiffened to help prevent nanotubes from exhibiting a tendency to bend or deflect. In addition, certain embodiments allow manufacturing techniques typically used in semiconductor fabrication to be employed to fabricate the nanofabric articles and devices as part of CMOS-based manufacture.

The nanofabrics may be patterned into ribbons, which can be used to create conductive or semiconducting elements. As explained in U.S. Patent Pub. No. 2005/0128788, entitled Patterned Nanoscopic Articles and Methods of Making the Same, filed Sep. 8, 2004, U.S. Pat. No. 7,0567,58, and U.S. Patent Pub. No. 2004/0164289A1, incorporated by reference in their entireties, the ribbons may be patterned and suspended over electrodes and between electrodes, acting as via or interconnect.

These patterned nanofabrics may be constructed to form suspended, conducting ribbons. Suspended, conducting ribbons act as very small, even nanoscopic, grids in the presence of adjacent emitters and collectors. The material chosen for the emitters can be any appropriate material, including, but not limited to metals, nanotubes, etc. Besides being used as a grid in the triode of the present invention, nanofabric may be formed into conductive traces and into pads to be used as collector or emitter. As explained in U.S. Pat. No. 6,706,402 and U.S. Pat. No. 6,759,693, entitled Nanotube Permeable Base Transistor, filed Jun. 19, 2002 (incorporated by reference in their entireties), a nanofabric trace has advantageous electrical and thermal conductivity properties, allowing extremely small feature sizes. This generation of nanoelectronic devices may also be used to increase the efficiency and performance of current electronic devices using a hybrid approach (e.g., using nanofabric-based triodes in conjunction with semiconductor addressing and processing circuitry). The fabrication process allows a single layer of fabric to be applied to a substrate and patterned, leaving patches or ribbons to be used as grid, collector or emitter. Details of fabrication processes are thoroughly described in U.S. patent application Ser. No. 60/775,461, entitled Methods of Forming Nanotube Based Contacts to Semiconductor, filed Feb. 21, 2007, the contents of which are incorporated by reference. The shorter, patterned segments or patches of nanotube fabric allow interconnection of the constituent nanotubes to vias, interconnects, traces or other structures useful in electronic integration.

The U.S. Patent Applications, identified and incorporated above, describe a broad variety of example uses of such fabrics and articles. The various masking and patterning techniques for selectively removing portions are useful because one continuous layer of nanotubes deposited on a pre-wired substrate may be patterned with a single mask to form different electronic elements. The different portions of the fabric may be used as many different electronic elements, including but not limited to triode grids. Various component architectures that are described in the incorporated applications may be used.

As detailed in the incorporated references, a nanofabric may be formed or grown over defined regions of sacrificial material and over defined support regions. The sacrificial material may be subsequently removed, yielding suspended nanofabric articles. See, for example, Electromechanical Memory Array Using Nanotube Ribbons and Method for Making Same (U.S. Pat. No. 6,919,592) filed Jul. 25, 2001, for an architecture with suspended ribbons of nanofabric.

Once created, the nanofabric may be stiffened so that when it is suspended, it does not flex in the presence of electromagnetic fields. Once such suspended fabric regions are stiffened, they are ideal for use as triode gates. Various embodiments of nanotube triodes having stiffened nanofabric articles and methods that increase rigidity in the nanofabrics for use in nanotube triodes are detailed below.

The composition of carbon nanotube fabrics may be controlled to create the desired nanotube triode structure and control the switching characteristics of the device. Specifically, methods may be employed to control the relative amount of metallic and semiconducting nanotubes in the nanofabric. This composition control may be accomplished by direct growth, removal of undesired species, application of purified nanotubes or other techniques. Methods for controlling the composition of nanotubes in nanofabrics are described in detail in U.S. patent application Ser. No. 10/341,130.

FIG. 1 shows a triode structure, according to a conventional design. By simply varying the voltage applied to the grid, the current between the triode's cathode and anode can be suppressed or increased. Conventional triode structures and functions are described, for example, in: K. K. Ng, Complete Guide to Semiconductor Devices, 2ed., Wiley-InterScience, New York, 2002 page 568.

Figure 2:
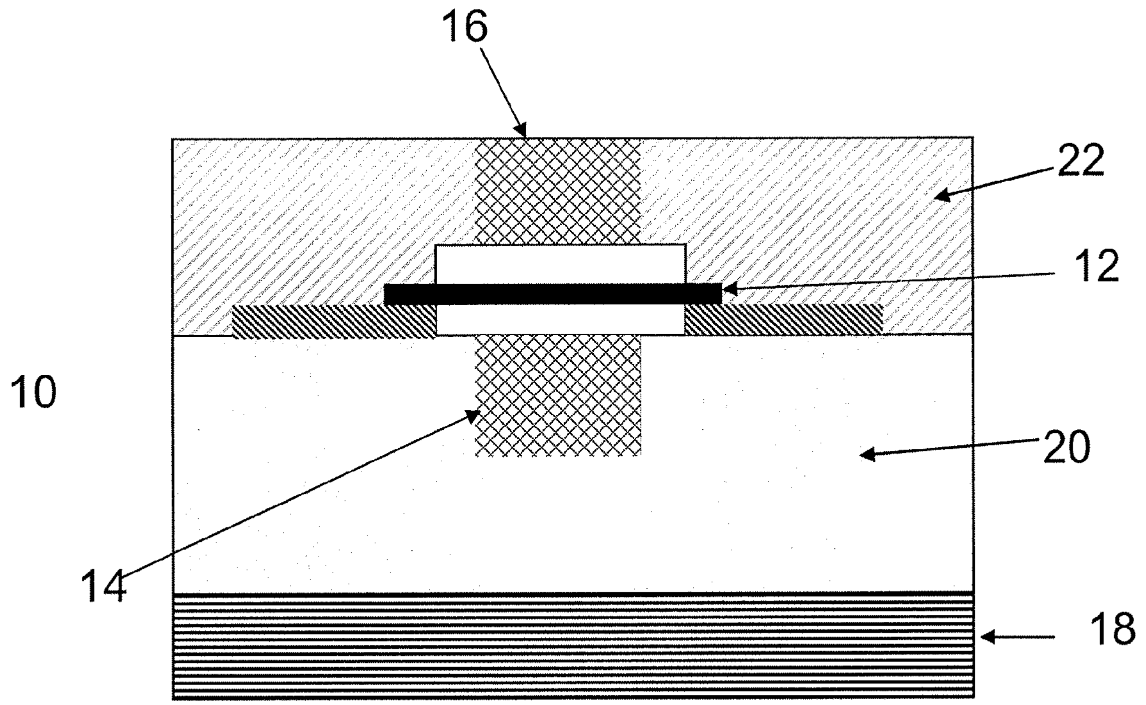
FIG. 2 illustrates a triode structure according to one aspect of the invention.

FIG. 2 illustrates an exemplary triode according to one embodiment. Triode structure 10 is illustrated with nanofabric layer 12, emitter 14, collector 16, substrate 18 and non-conductive layers 20 and 22. The nanofabric layer is disposed between emitter 14 and collector 16, and while collector 16 is shown superior to layer 12, it may be disposed inferior to the layer 12. The nanofabric layer may comprise, in certain embodiments, a thin foil of nanotubes, stiffened according to the below-disclosed techniques.

Figure 3A:
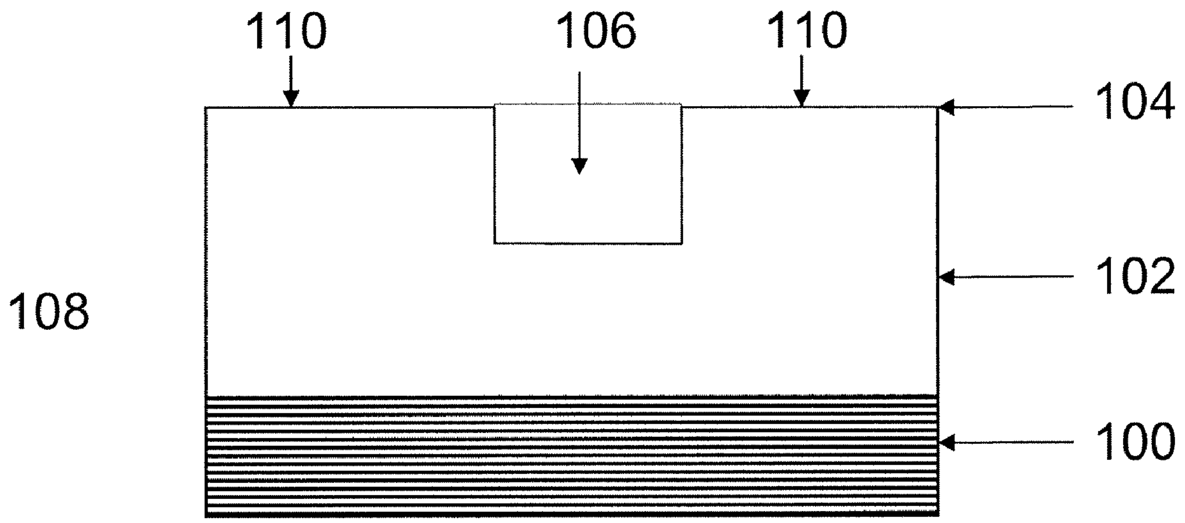
FIGS. 3A-3P illustrate steps in the fabrication of a nanotube fabric triode with a horizontally disposed grid according to one aspect of the invention.
Figure 3B:
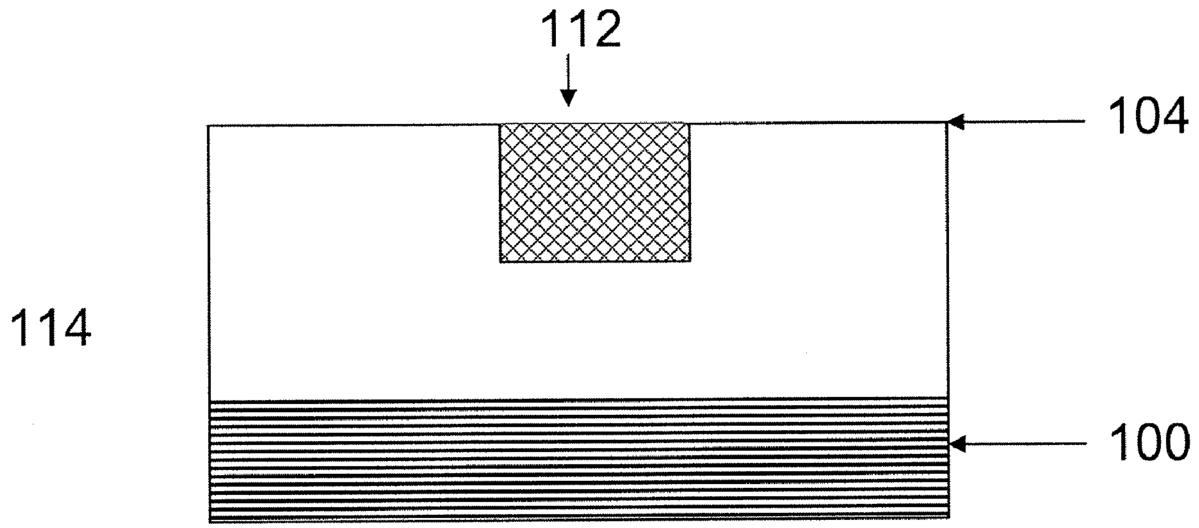
Figure 3C:
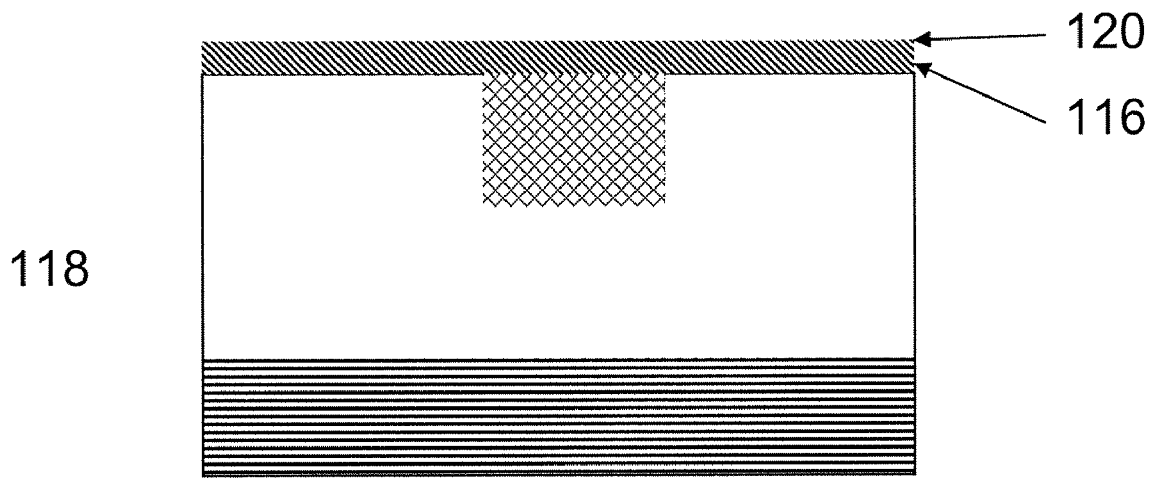
Figure 3D:
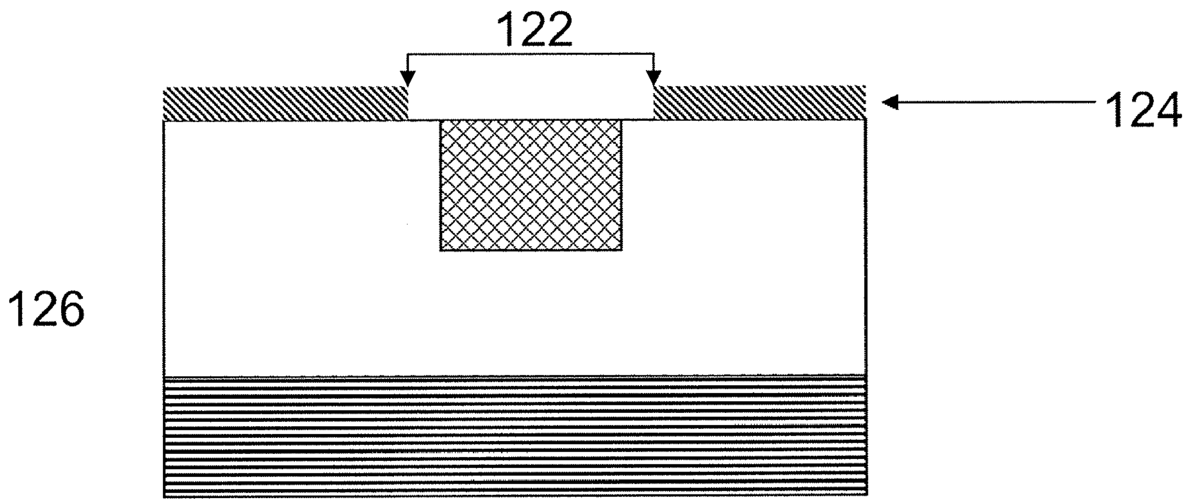
Figure 3E:
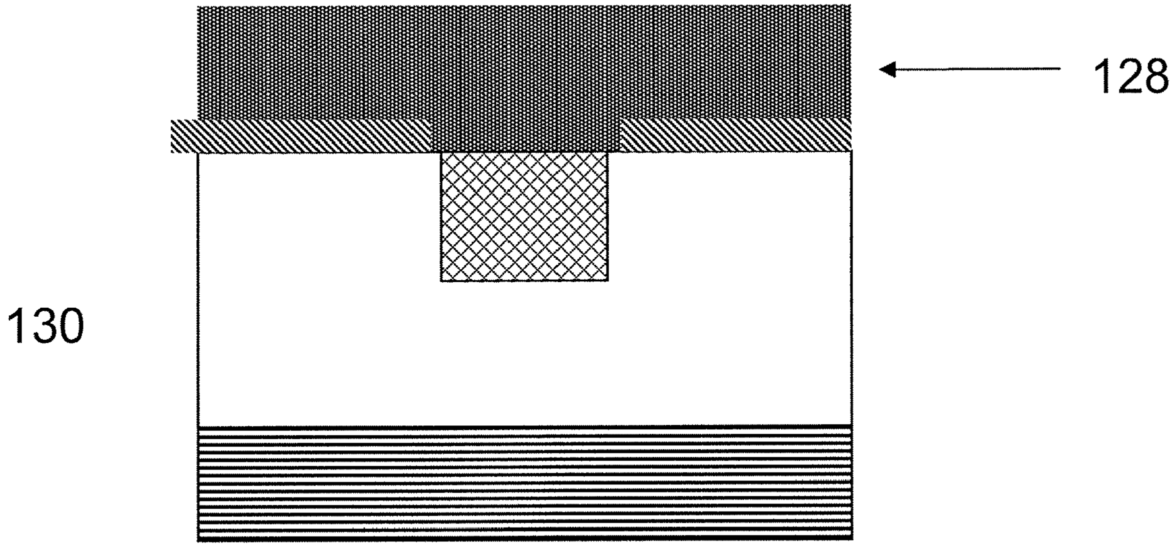
Figure 3F:
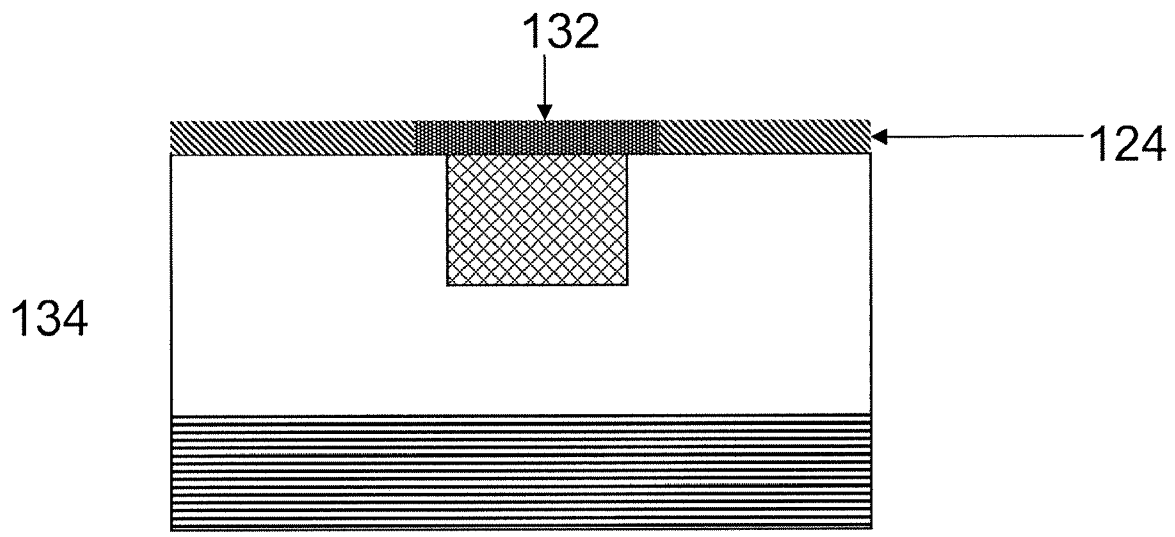
Figure 3G:
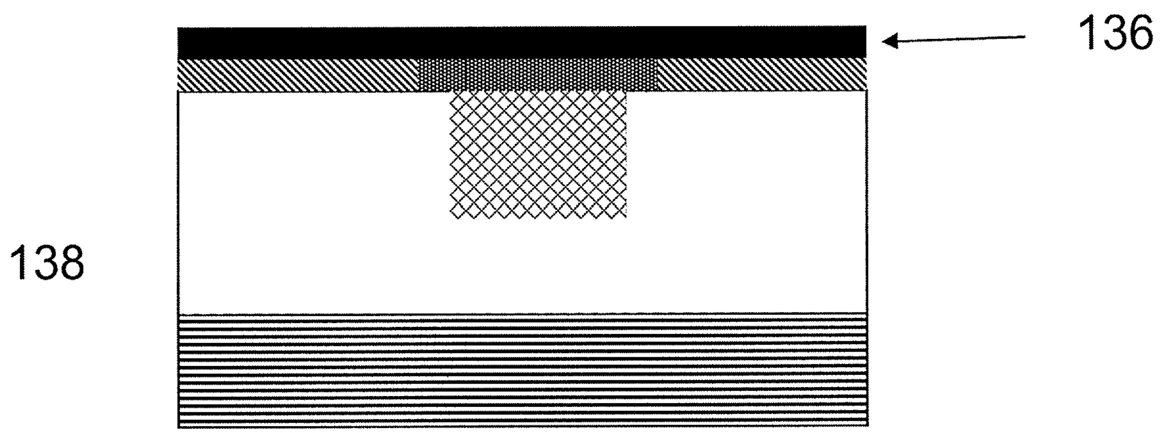
Figure 3H:
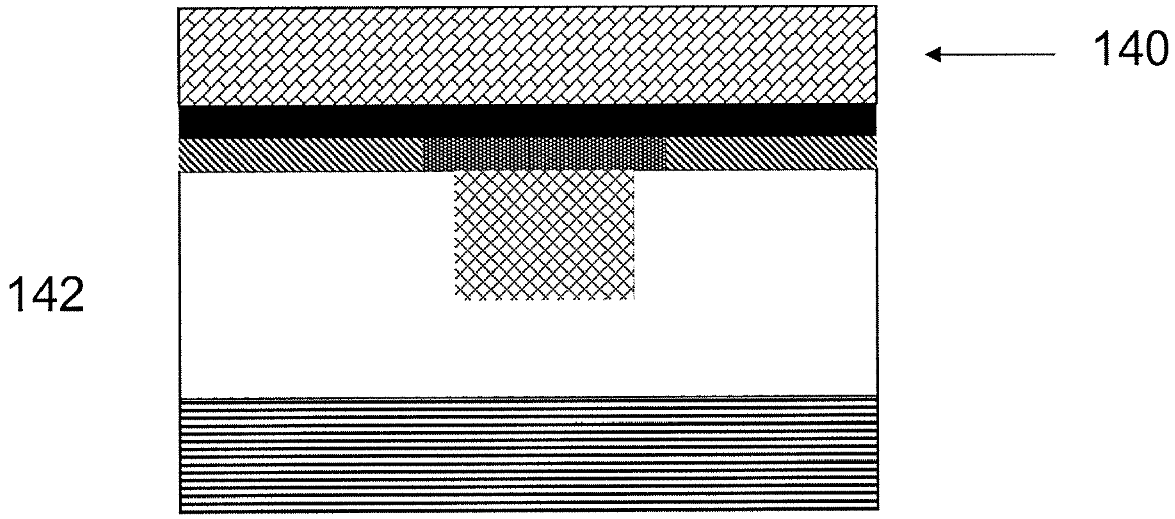
Figure 3I:
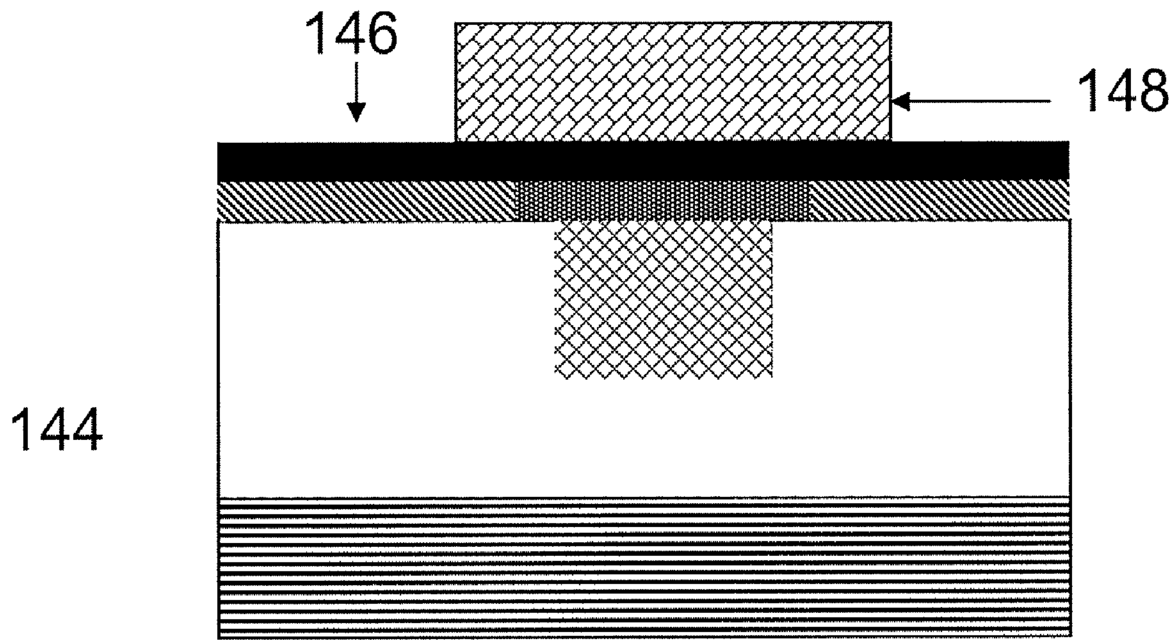
Figure 3J:
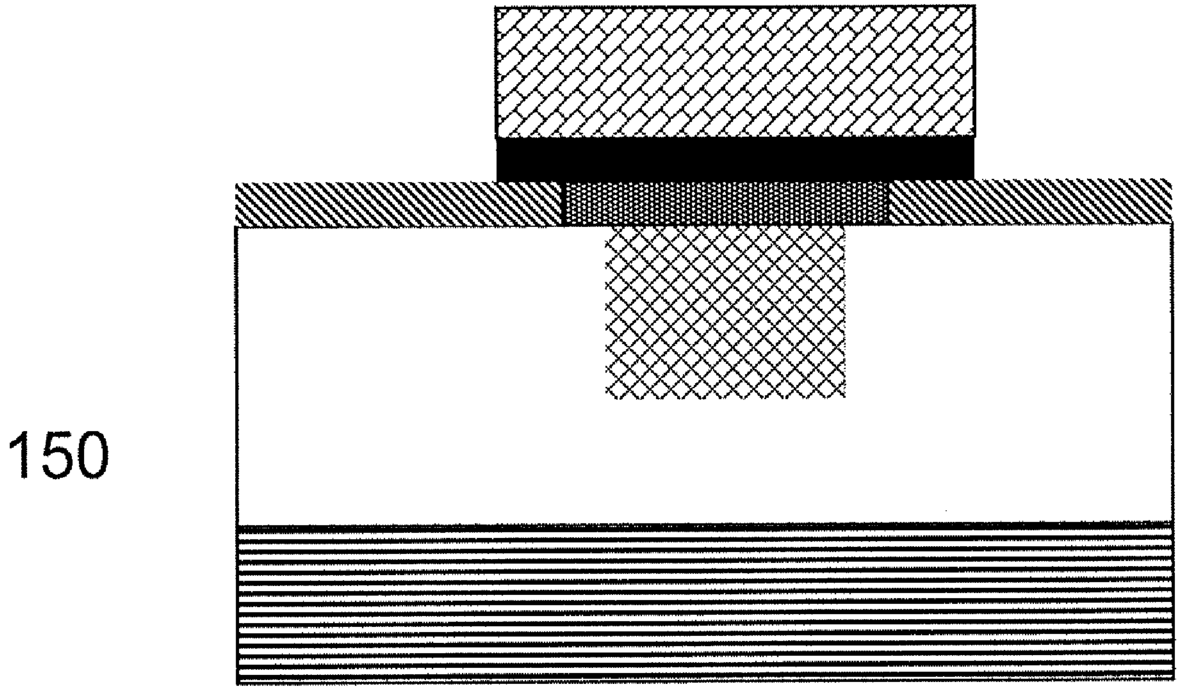
Figure 3K:
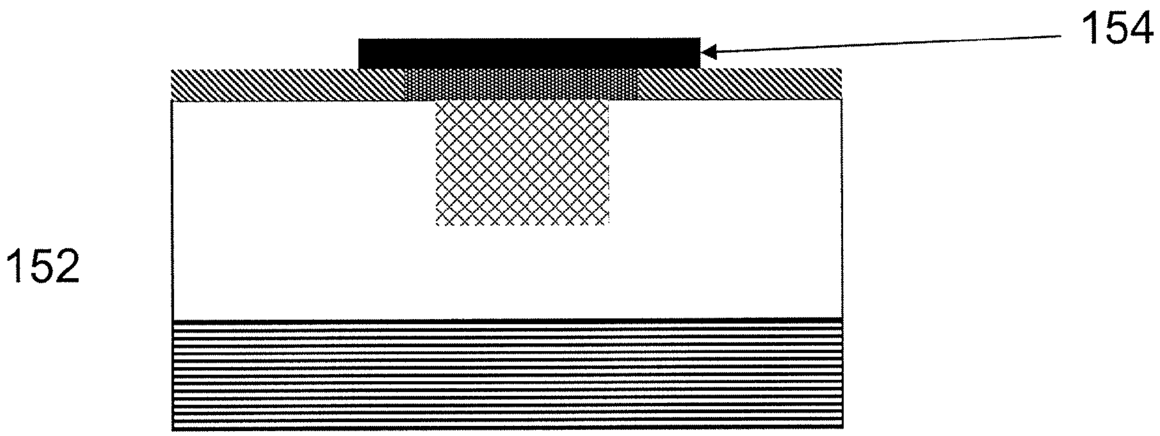
Figure 3L:
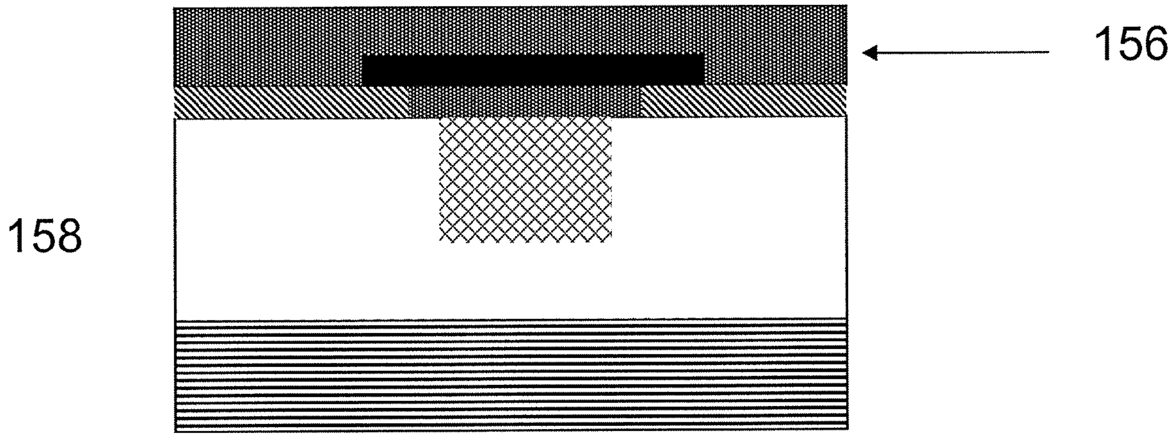
Figure 3M:
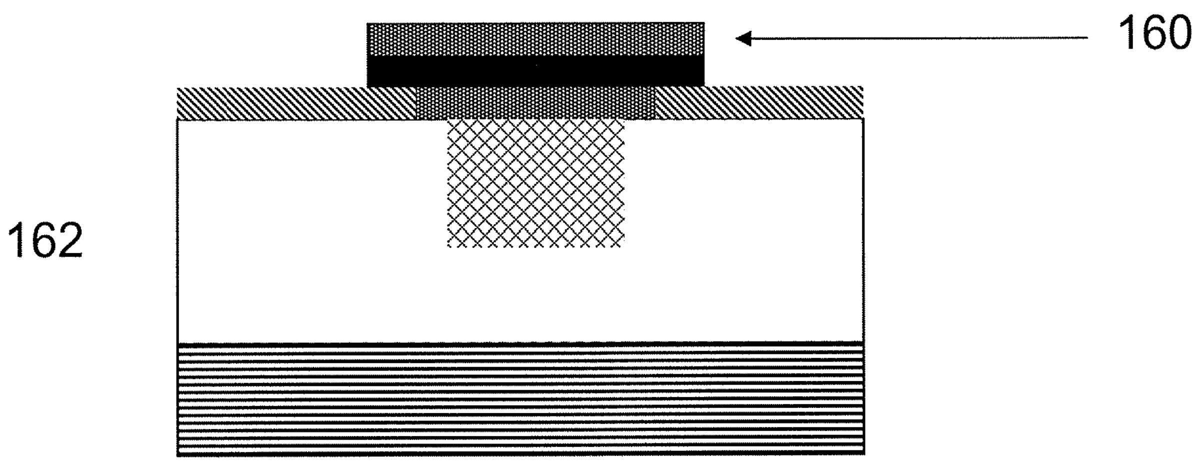
Figure 3N:
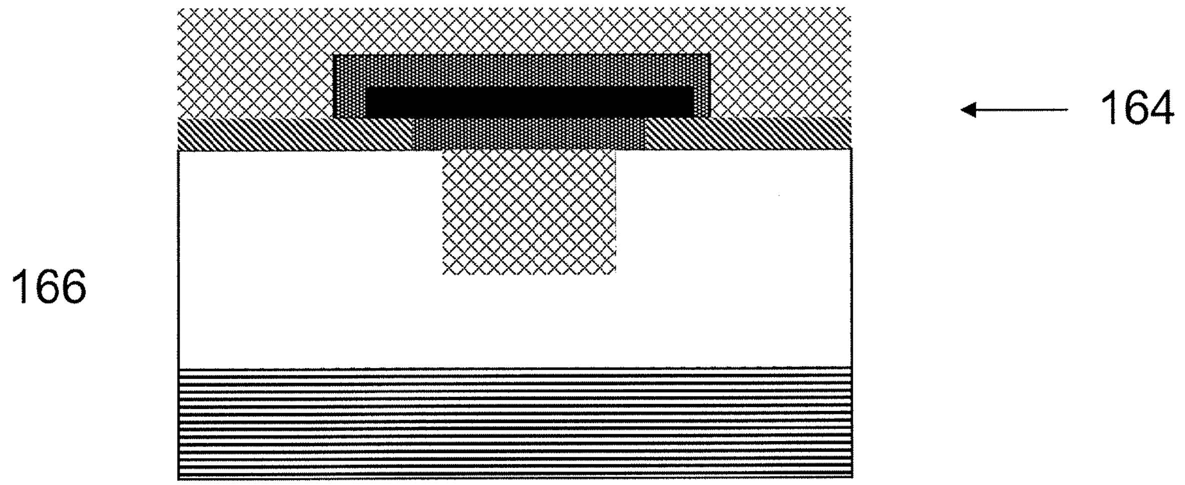
Figure 3O:
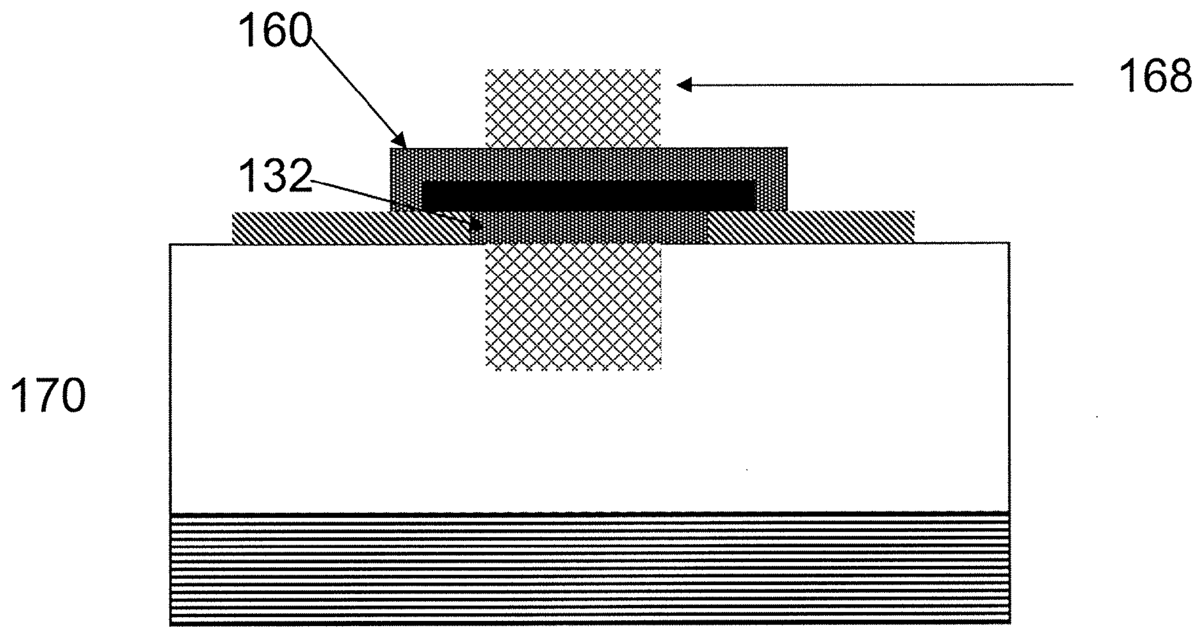
Figure 3P:
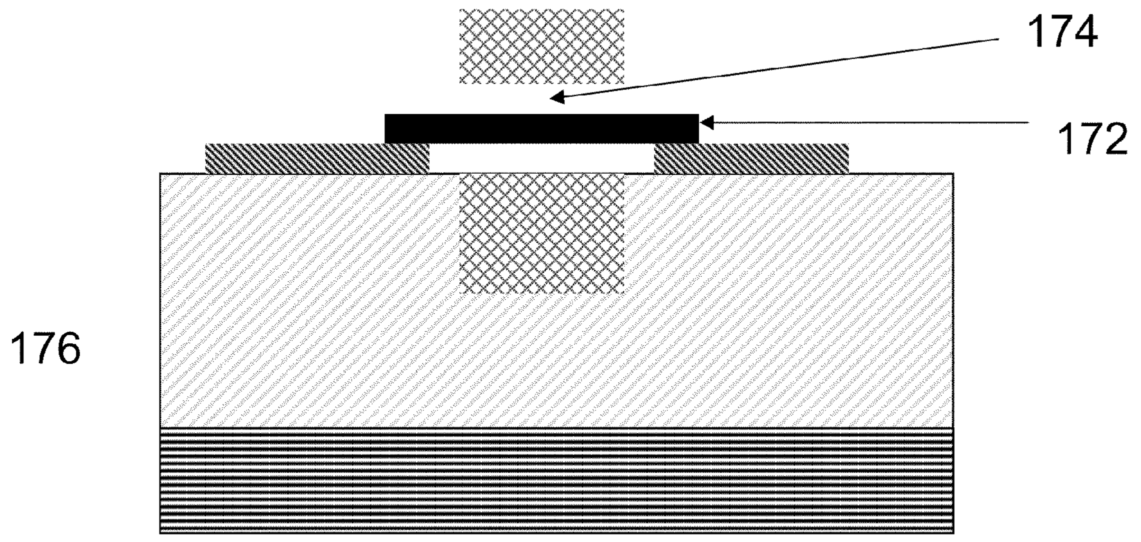

A horizontally oriented, partially coated nanofabric may be created in a variety of fabrication sequences, one such procedure detailed in FIGS. 3(A)-(P). Specifically, FIGS. 3(A)-(P) collectively illustrate one method of creating a horizontally oriented fabric-based triode, where a nanofabric is employed as the grid structure between the cathode and anode plates.

A silicon wafer substrate 100 with an insulating or oxide layer 102 is provided. Alternatively, the substrate may be made from any material suitable for use with lithographic etching and electronics and the oxide layer 102 can be any suitable insulator, with the oxide layer 102 having a top surface 104. The oxide layer 102 is a few nanometers in thickness, but could be as much as 1 μm thick. The oxide layer 102 is patterned and etched to generate cavities 106 to form support structure 108, as shown in FIG. 3(A).

With modern techniques, the cavity width may be fabricated to be as narrow as about 20 nm wide or smaller depending upon the type of lithographic patterning technique selected. The cavity can be wider or narrower, depending on the application and the manufacturing method used. The remaining oxide material provides supports 110 on either side of cavity 106. A lower electrode 112 is deposited in the cavities 106; the electrode material can be chosen from any suitable conductor or even semiconductor material, and the lower electrode may be emitter or collector, if used as collector. (In the present disclosure, the lower electrode will be referred to as lower electrode, but it may be understood to comprise a collector or emitter). The lower electrode 112 is planarized such that its top surface is substantially level with the top surface 104 of oxide layer 102, forming intermediate structure 114 (FIG. 3(B)).

Intermediate structure 114 is illustrated in FIG. 3(B). Lower electrode 112 can be a prefabricated contact plug or a via. Also, lower electrode 112 can be deposited or fabricated in other ways, including by forming on the surface of substrate 102. Lower electrode 112 can be a patterned thin film metal or metal alloy. The lower electrode 112 may also be a fabric of carbon nanotubes (using sidewall emission from the nanotubes) or a collection of free standing nanotubes (for tip emission) that are either fabricated similarly to such emitters as described in Bower, App. Phys. Lett. 80, or by lithographically patterning vias and depositing nanotubes within the via by spin-coating, spray coating and other techniques (see: U.S. Pat. No. 6,706,402; 6,835,591 and U.S. patent application Ser. Nos. 10/341,055, 10/341,054, and 10/341,130). Methods of forming nanofabric electrodes are described herein and in the incorporated references. The lower electrode may also consists of free-standing nanowires including, but not limited to, Cu nanowires (See Thurn-Albrect, et al., "Ultrahigh-density nanowire arrays grown in self-assembled diblock copolymer templates", Science, 290, (2000), 2126-2129).

Insulator layer 116 is then deposited on the surface of structure 114, forming intermediate structure 118 (FIG. 3(C)). The insulator layer may comprise Silicon nitride or any other suitable material. Layer 116 has a top surface 120. A non-limiting example of silicon nitride thickness is approximately 20 nm for 0.15 micron (or smaller) ground rule (GR). The inventors envision that the nitride thickness will vary depending on the minimum critical dimension of the desired final product and the dielectric strength and dielectric constant of the insulator material. These dimensions affect emitter voltage and these dimensions are variable based on the desired electrical behavior of the triode.

The silicon nitride layer 116 of structure 118 is then patterned and etched to generate cavities, corresponding in size and shape to the grid suspension regions 122, above lower electrode 112, leaving remaining silicon nitride layer 124, thus forming intermediate structure 126 (FIG. 3(D)).

A sacrificial layer 128, is deposited on the surface of intermediate structure 126, forming intermediate structure 130 (FIG. 3(E)). The sacrificial material may consist of polysilicon, amorphous silicon, germanium, aluminum, alumina, etc., or any suitable material that is not instrumental to the operation of the device and can be removed readily without any degradation in the electrical output of the triode structure. A non-limiting parameter for the thickness of polysilicon layer 128 is on the order of approximately 100 to 200 nm. A polysilicon layer 128 of this approximate thickness range will provide a substantial base for chemical mechanical planarization.

The top surface of intermediate structure 130 is planarized such that the surface of the remaining polysilicon layer 132 is substantially level with the top surface of remaining nitride layer 124, thus forming intermediate structure 134 (FIG. 3(F)). The formation of the sacrificial layer FIGS. 3D-3F can also be formed by a lift-off procedure where the insulator material 116 is etched to form via 122 and filled with sacrificial material 128 before the photoresist is removed to form structure 134.

A nanotube fabric 136 is applied to, or formed on, the surface of intermediate structure 134, thus forming intermediate structure 138 (FIG. 3(G)); non-limiting methods of applying such a fabric are: by spin coating, aerosol application, dipping or by chemical vapor deposition as described in the references listed and incorporated above. A stiffening agent (coating that causes the fabric to become rigid) or stiffening process (e.g. ion or electromagnetic bombardment performed to form a membrane carbon nanotube fabric), neither shown, is applied/performed to nanofabric layer 136 before patterning of the fabric. Alternatively, the stiffening agent or stiffening process may be applied or performed during a later process such as to the patterned fabric ribbon 154, see FIG. 3(K). Methods of applying such a stiffening agent include by low pressure chemical vapor deposition, evaporation and sputter coating, depending on physical characteristics of desired fabric. Stiffening agents may be any appropriate material which coats (partially or fully) nanofabric 136 thereby preventing it from deflecting and possibly contacting the emitter or the collector, but not forming a substantially thick film that will adversely affect the electrical properties of the triode. Stiffening agents include, but are not limited to: semiconductors, insulators and metals, including silicon, silicon nitride, silicon dioxide, titanium, titanium nitride, gold, copper, aluminum, molybdenum, germanium, etc. An exemplary method of applying a stiffening agent is by evaporating 1 to 5 nm silicon dioxide onto the nanofabric. Another stiffening process involves the electromagnetic or ion bombardment of the nanotube fabric, causing the "welding" or "fusing" of nanotubes at junction sites. The process of electromagnetic or ion bombardment also stiffens the nanotubes, preventing the ability to mechanically deform the nanotubes. The degree of stiffening can be tailored to vary the degree of nanotube fabric stiffening. Electromagnetic or ion bombardment can be accomplished by exposing the patterned fabric to electrons, ions and electromagnetic radiation.

Resist layer 140 is applied to the surface of intermediate structure 138 forming intermediate structure 142 (FIG. 3(H)).

A region of the nanotube fabric larger than the nanotube grid suspension region 122 is patterned by: first lithographically patterning the resist layer 140, forming intermediate structure 144 (FIG. 3I)), which comprises exposed nanofabric portions 146, and by etching exposed nanotube fabric 146, forming intermediate structure 150 (FIG. 3(J)). A non-limiting method of etching the nanotube fabric is by plasma ashing.

Alternatively nanofabric is patterned to create grid suspension region 122 by: first lithographically patterning the resist layer 140, forming intermediate structure 145 (FIG. 3(I')), having exposed nanotube portion 147 leaving remaining resist layer 149. Next, polysilicon layer 157 is deposited over the exposed nanotube region 147 and onto the remaining photoresist layer 149, forming intermediate structure 151 (FIG. 3(J')). Remaining photoresist layer 149 is then removed in a liftoff process, leaving polysilicon layer 160 over nanotube region 122. The exposed nanofabric is removed, e.g. by ashing, forming intermediate structure 162 (FIG. 3(M)); remaining polysilicon layer portion 160 is larger than nanotube grid suspension region 122 (and is the same size or larger than the underlying patterned nanotube fabric 154). Note that thicknesses of layers are not necessarily drawn to scale.

The patterned resist layer 148 is removed, forming intermediate structure 152 (FIG. 3(K)), having patterned nanotube fabric 154.

A sacrificial layer 156, such as the sacrificial material deposited in 3(E), is deposited over the surface of intermediate structure 152 to form intermediate structure 158 (FIG. 3(L)). A non-limiting range of polysilicon layer 156 thickness is between about 20 to 50 nm. The sacrificial layer 156 is patterned forming a remaining sacrificial layer portion 160 over nanotube grid suspension region 122, forming intermediate structure 162 (FIG. 3(M)); remaining sacrificial layer portion 160 is larger than nanotube grid suspension region 122 (and is the same size or larger than the underlying patterned nanotube fabric 154).

Top electrode material 164 is deposited over the top surface of intermediate structure 162, forming intermediate structure 166 (FIG. 3(N)). A non-limiting thickness of electrode material 164 is on the order of about 350 nm. The material for use as top electrode 164 can be selected from any metal or conductor suitable for electronic components. Alternatively, nanofabric may be used as top electrode. The deposition and patterning of such a nanofabric layer is described in incorporated references. In yet other embodiments, the electrode material 164, or alternately a nanofabric layer, may be used as a lower electrode in certain configurations (e.g. lower electrode 112 seen in FIG. 6). The top electrode may also be defined as a line or a slot landing pad or other structure suitable for interconnection.

Top electrode material 164 is patterned to form electrode 168 (FIG. 3(O)). Remaining sacrificial layer portion 160 and remaining sacrificial layer 132 are etched away to create structure 176 (FIG. 3(P)), a structure with suspended nanotube fabric 172 and air gap 174 in the location which was occupied by remaining sacrificial layer portion 160.

Figure 4A:
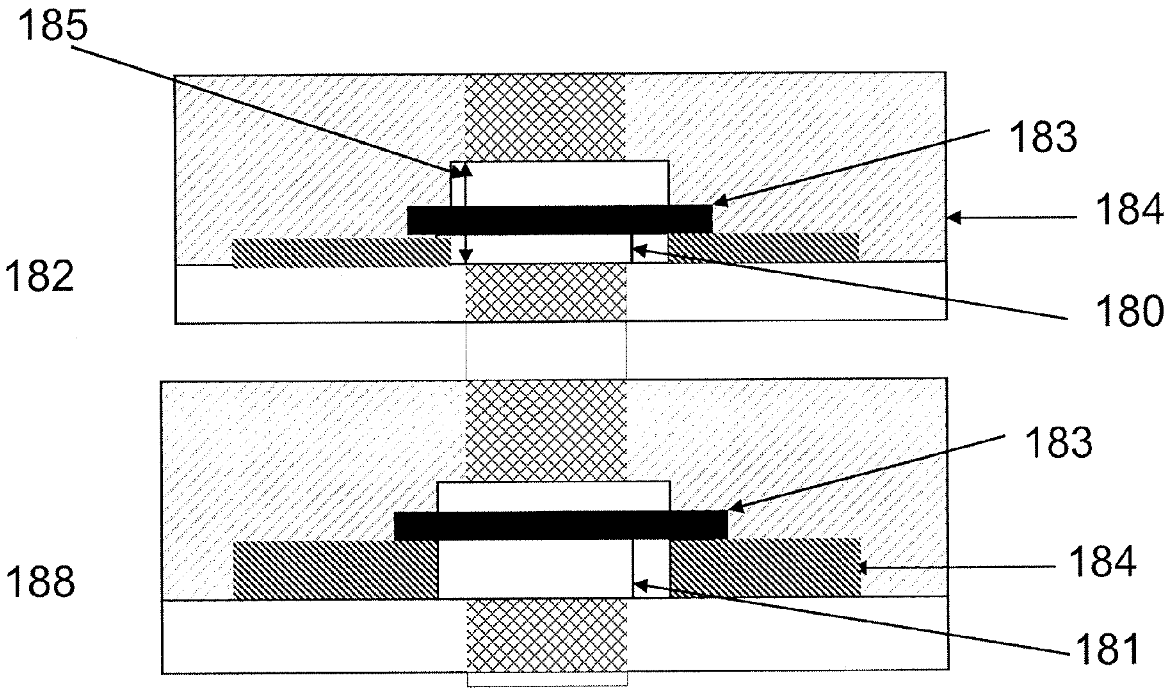
FIGS. 4A-4B illustrate metallization and encapsulation schemes according to other aspects of the invention.

FIG. 4(A) illustrates a metallization and encapsulation scheme that can be made from a structure like structure 176. The nanofabric grid in structure 176 has been encased by insulating material 178 and has a gap height 180, forming structure 182. In some embodiments, the gap height 180 is a function of the thickness of sacrificial layers 132, 160 (see FIG. 3(P) above). The nanofabric grid may be located closer to top electrode 168 as shown in FIG. 4A, structure 182 or closer to bottom electrode 112, as shown in FIG. 4A, structure 188. (Structure 188 having a relatively larger gap distance 186, than gap distance 180 of structure 182).

Subsequent metallization may be incorporated to create interconnects; such connections may be made by any suitable method, such as by etching or exposure to form a channel 333 (not to scale) or via connecting the nanofabrics 190 with an activation electrical signal. Channel 333 is used for electrical connection of the grid. The channel 333 may subsequently be filled with a conductor to achieve the activation connection, or may be formed by some other technique.

Figure 4B:
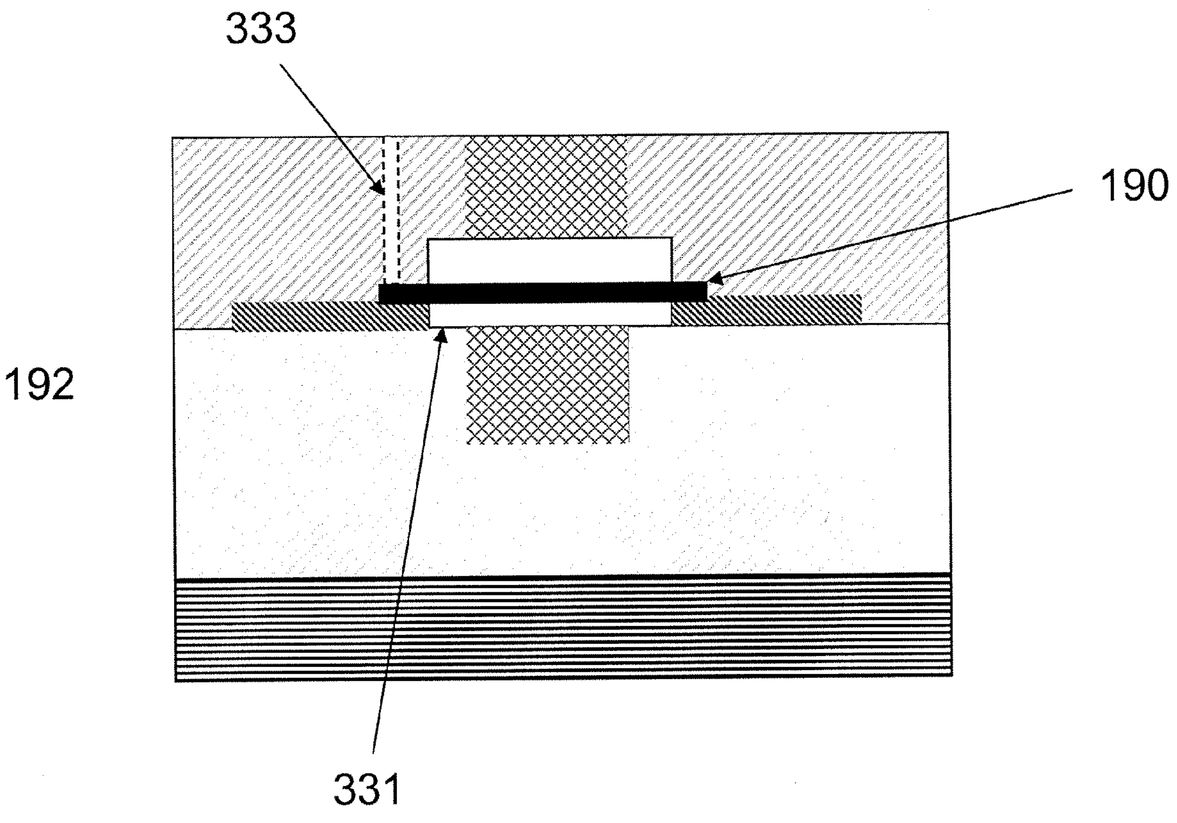

For example, with reference to FIG. 4(B), connection channel 333 extends down to the nanofabric 190. Then a metal filling the channel 333 may further be introduced into the pores of nanofabric 190, in region 334. The matrix material extends down to the underlying nitride layer (or any other layer) below the nanofabric 190. The effect of such a connection can be to secure the nanofabric 190 and increase the strain on the nanofabric 190. Also, the electrical connection between nanofabric 190 and the activation connection is increased.

Almost any material can be made to penetrate into or through a porous thin article such as a nanofabric. Depending on the materials used, a bond may form between the penetrating matrix material and the material below the nanofabric. Examples of materials which can be used to secure a nanofabric in this way include metals and epitaxial silicon crystal materials. Other uses for such junctions are possible, for example in the manufacture of permeable base transistors. It is worth noting that the composite junctions and connections described above do not cause a disruption in the fabric of the nanofabric materials into which the impregnating matrix material is introduced. That is, connection channel 333 does not itself cut through the nanofabric 190, but rather just allows a filler matrix material to flow into and through the nanofabric 190 and connect it to other components of the device.

Under certain embodiments as shown in FIGS. 4(A)-(B), a nanotube ribbon 183 has a width of about 180 nm and is pinned to a support 184 which may be fabricated of silicon nitride. The local area under ribbon 183 forms an n-doped silicon electrode and is positioned close to the supports 184 and preferably is no wider than the belt, e.g., 180 nm. The relative separation 185 from the top of the support 184 to the lower electrode (anode or cathode) may be approximately 5-50 nm. The 5-50 nm separation is useful for certain embodiments utilizing ribbons 183 made from carbon nanotubes, but other separations may be desirable for other materials. These feature sizes are suggested in view of modern manufacturing techniques. Other embodiments may be made with much smaller (or larger) sizes to reflect the manufacturing equipment's capabilities.

The nanotube ribbon 183 of certain embodiments is formed from a non-woven fabric of entangled or matted nanotubes (more below). Unlike conventional nanotube-based devices which rely on directed growth or chemical self-assembly of individual nanotubes, the present nanotube triode structure utilizes fabrication techniques that involve thin films and lithography. This method of fabrication lends itself to generation over large surfaces especially wafers of at least six inches. (In contrast, growing individual nanotubes over a distance beyond sub-millimeter distances is, at the time of this application, impractical.) The ribbons should exhibit improved fault tolerances over individual nanotubes, by providing a redundancy of conduction pathways contained with the ribbons. (If an individual nanotube breaks other nanotubes within the ribbon provide conductive paths. In contrast, if only one nanotube were relied upon for the conductive pathway, any faults would create an open circuit.) Moreover, the resistances of the ribbons should be significantly lower than that for individual nanotubes, thus, decreasing its impedance since the ribbons may be made to have larger cross-sectional areas than individual nanotubes.

While a monolayer fabric of single-walled nanotubes is typically used, for certain applications it may be desirable to have multilayer fabrics. Multilayered fabrics have the advantage of increasing current density, redundancy or other electrical characteristics or properties in the case of nanofabric used as emitter or collector or to decrease the porosity of the nanofabric in the case where it is used as grid/gate. When used as a grid in a triode, the mesh should remain sufficiently porous. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface derivitization, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

In certain embodiments, the porous non-woven grid fabric is either coated by a secondary material or exposed to an irradiation source to form a rigid structure that cannot be readily deformed during application of a strong electric field. With a coated fabric, the nanotubes are coated with a monolayer of material that maintains the highly porous structure of the fabric. This coating substantially prevents mechanical deformation of the fabric and allows for gating of the electron beam during emission. Similar characteristics are desirable for an irradiated fabric that will form a membrane nanotube structure.

It should be understood that the processes and elements described above with reference to a single cell only, for the sake of simplicity. The processes and structure may be easily extended to provide nanotube arrays. One of skill in the art will understand how to apply the concepts disclosed to a full array of cells.

FIGS. 5 through 8 show partial structures according to the various embodiments and illustrate some of their components.

Figure 5:
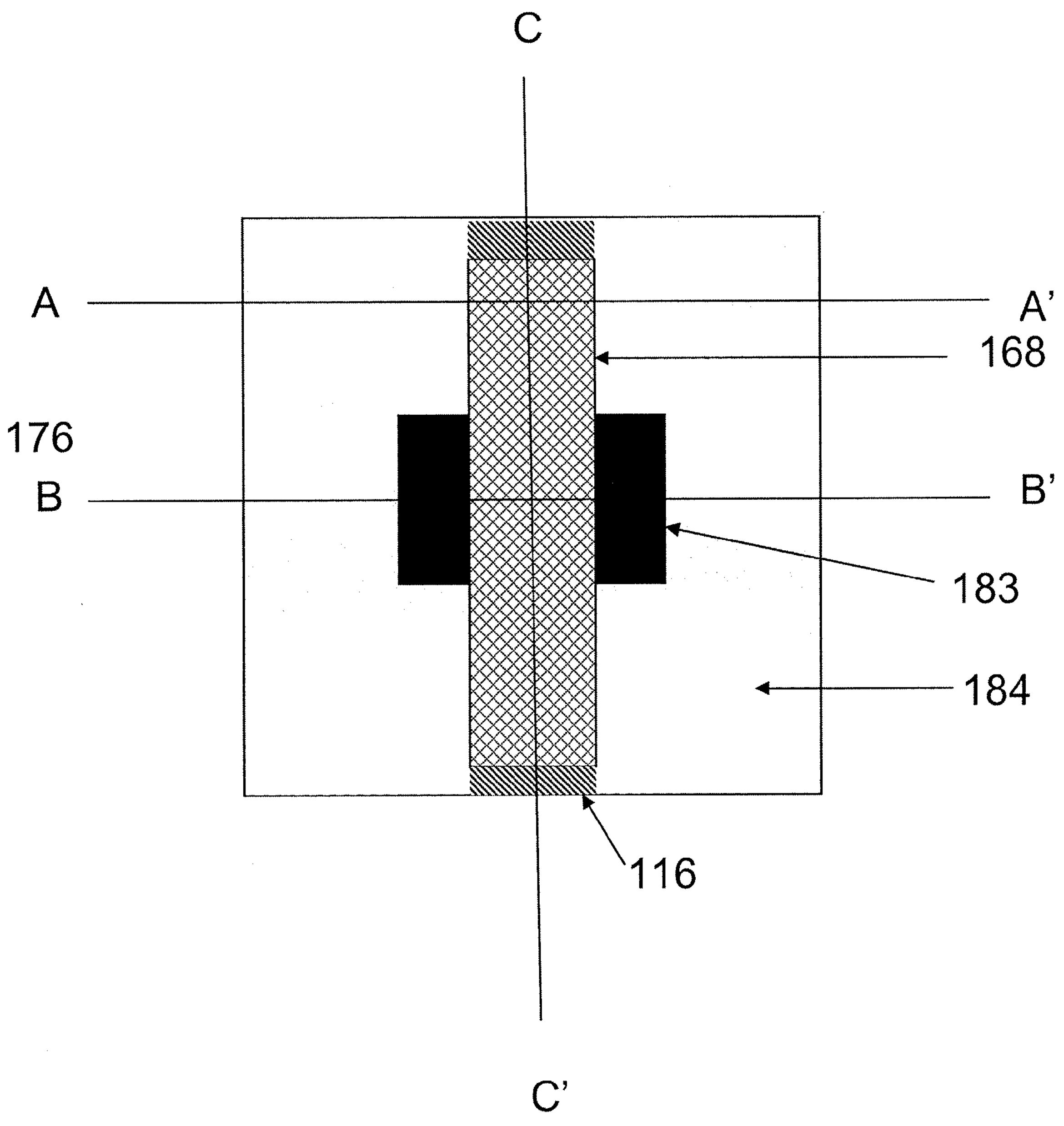
FIG. 5 illustrates a horizontally disposed nanotube fabric-based triode according to one aspect of the invention.

FIG. 5 illustrates a plain view of intermediate structure 176. Structure 176 having a support 184, a nitride layer 116, a nanofabric trace 183, and an upper electrode 168. Cross sections A-A', B-B' and C-C' are shown for reference. The relative positioning of each of these elements will be better explained immediately below.

Figure 6:
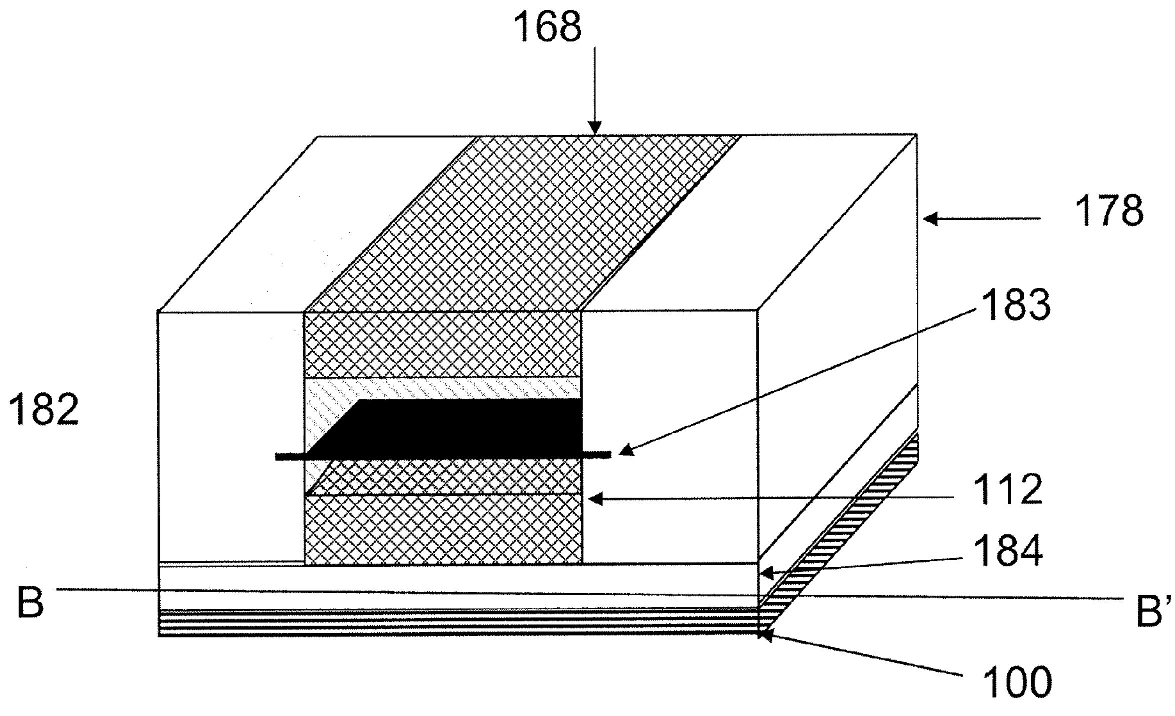
FIGS. 6-8 are perspective views of various embodiments of the invention.
Figure 7:
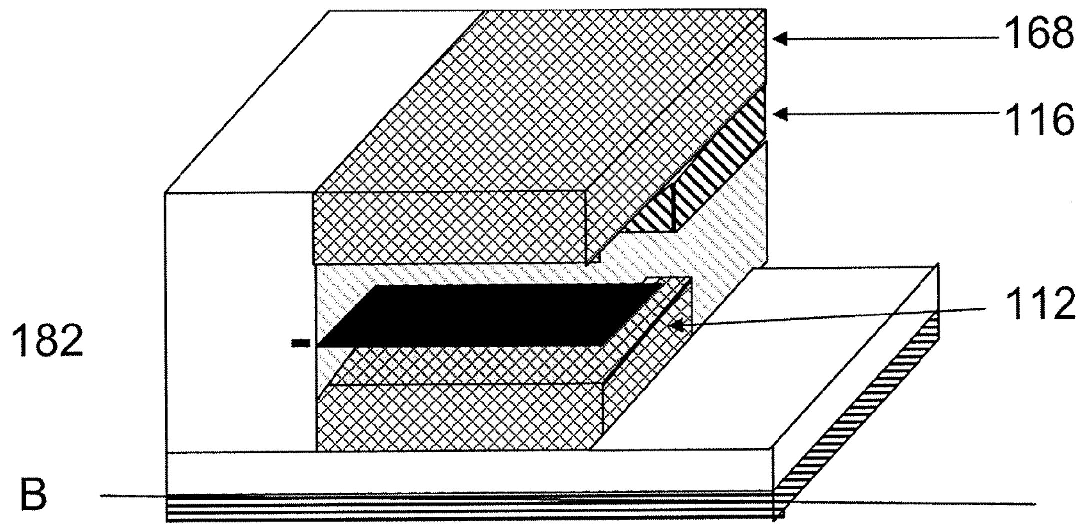
Figure 8:
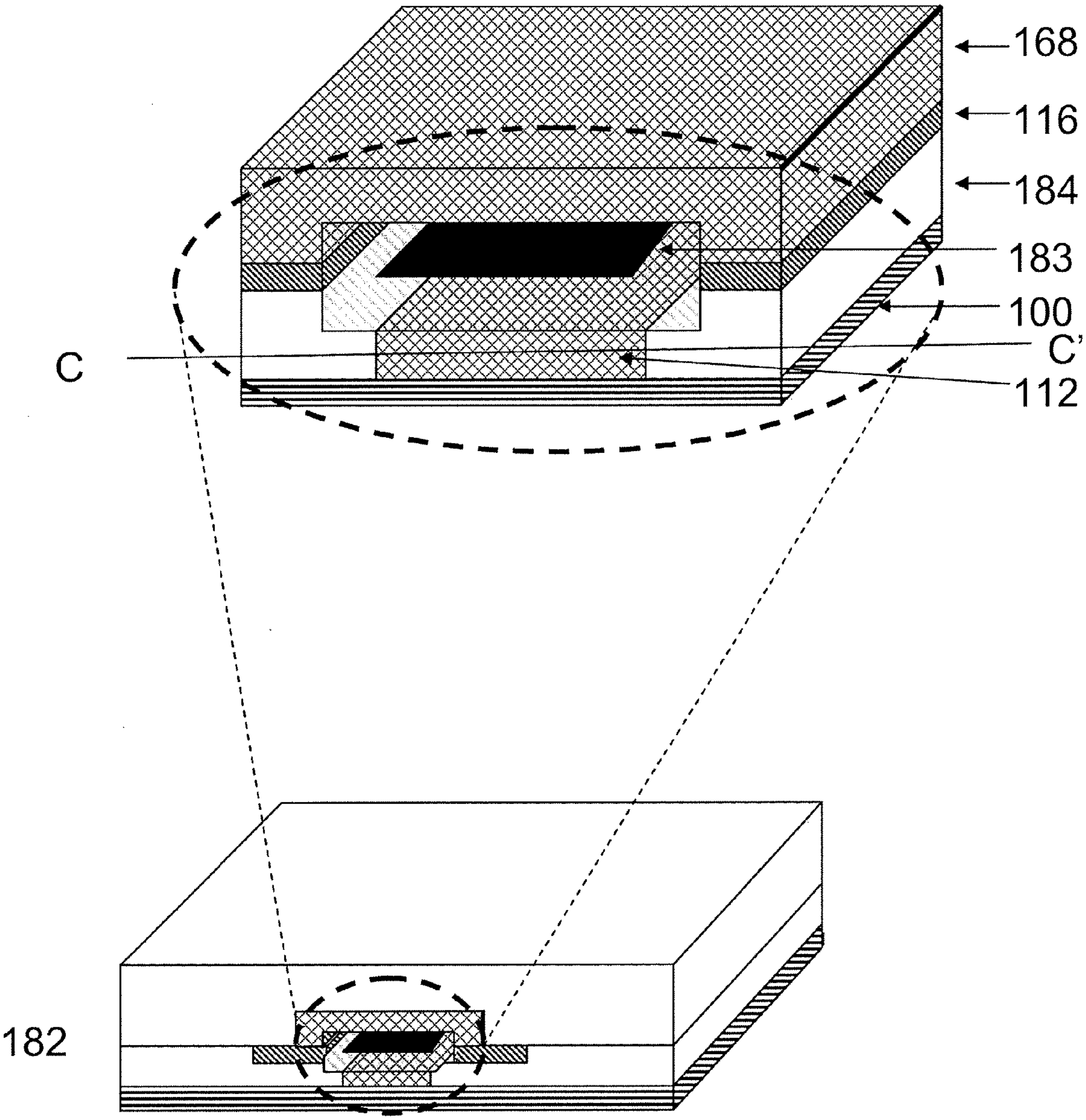

FIGS. 6-8 are perspective views of intermediate structure 182 at cross sections B-B' and C-C' (structure 176 is structure 182 with the top insulating layers removed for clarity).

FIG. 6 illustrates structure 182, which is structure 176 seen at cross-section B-B'. Structure 176 includes a nanofabric 183, a lower electrode 112, an upper electrode 168, insulating support 178 and support 184 and substrate 100. Support 184 is disposed on substrate 100. Support 178 and lower electrode are disposed on support 184. Nanofabric grid 183 is supported by support 178, and is in spaced relation to and disposed below upper electrode 168.

FIG. 7 illustrates structure 182 with a portion of support 178 removed for clarity. Note that nitride layer 116 is disposed below upper electrode 168.

FIG. 8 illustrates a view of a nanofabric-based triode structure at the cross section C-C' and a blown-up portion of structure 182 according to one aspect of the invention. While from this perspective of cross-section C-C', it does not appear as though nanofabric 183 is contacting any other element, it can be seen in FIG. 7 that the nanofabric is, in fact, contacting other elements, e.g. insulating layer 178 (not shown in FIG. 8). The exploded view (shown within the dotted lines) illustrates the interrelations of substrate 100, insulating layer 184, insulating layer 116 and electrodes 112 and 168, as well as the location of nanofabric 172 in reference to the aforementioned elements.

Note that the electrodes, e.g. the top electrode 168, may themselves be formed of nanofabric materials. In some embodiments, having a nanofabric ribbon or other nanofabric article disposed above nanofabric element 172, instead of a metallic electrode, permits removal of sacrificial materials from below the top electrode. Fluid may flow through a nanofabric material disposed above a sacrificial layer to remove the sacrificial material. Likewise, the lower electrode may be formed of a nanofabric material if desired. Either or both of the electrodes may be coated or partially coated with metal or other material, or they may remain an uncoated fabric of pristine nanotubes.

Figure 9:
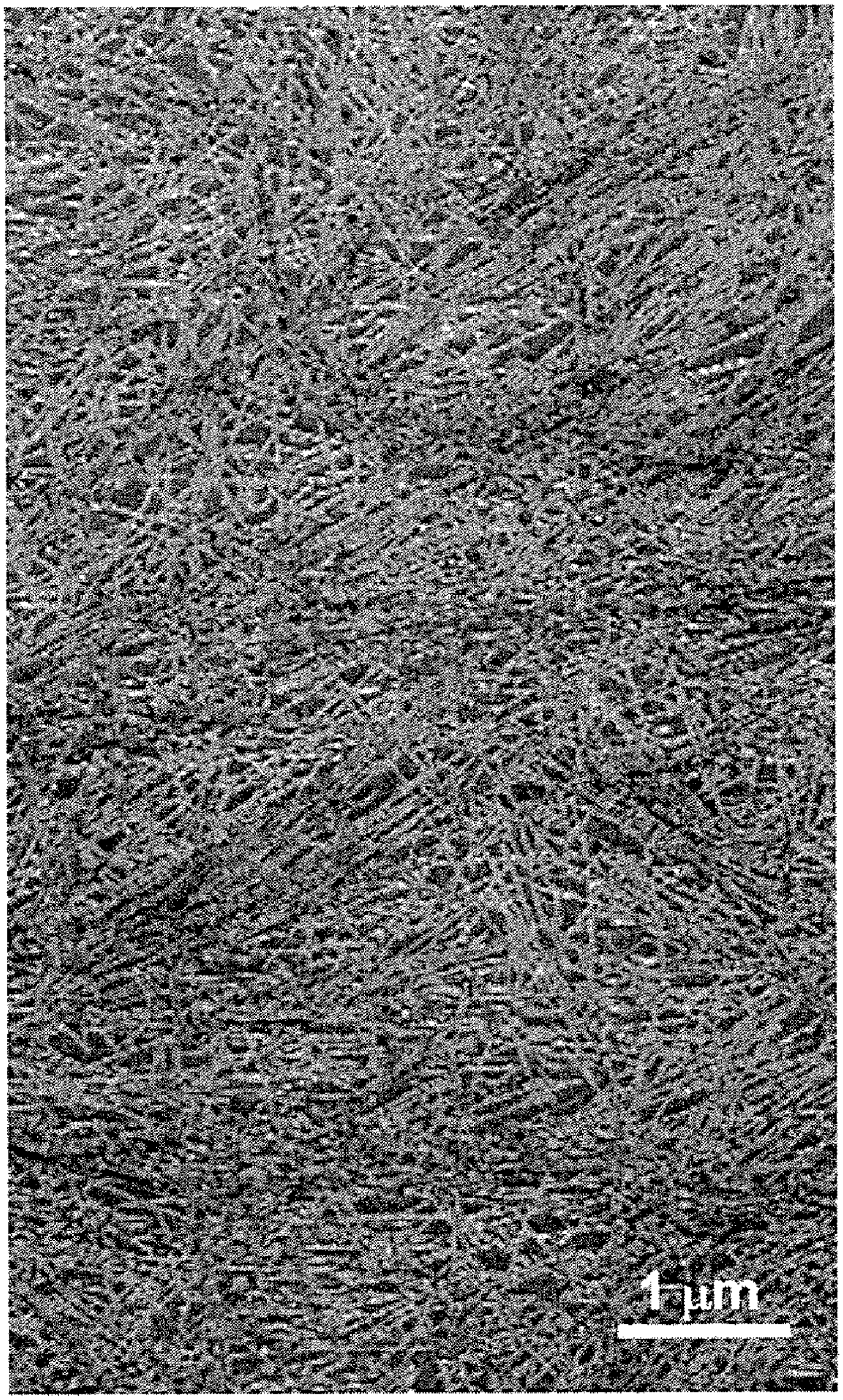
FIG. 9 is a micrograph of stiffened nanotube fabric, according to certain embodiments.

FIG. 9 is a micrograph of a stiffened nanofabric article. Stiffening of nanofabrics may be accomplished through sputtering, evaporating or annealing protocols or any other appropriate methods including chemical alteration of fabrics through gas phase manipulation utilizing covalent or non covalent modification. Techniques are described in detail in U.S. Pat. Pub. No. 2005/0053525, entitled Horizontally-Oriented Sensor Constructed with Nanotube Technology, filed May 12, 2004 and U.S. Pat. Pub. No. 2005/0065741, entitled Vertically-Oriented Sensor Constructed with Nanotube Technology, filed May 12, 2004, the entire contents of which are herein incorporated by reference.

It will be further appreciated that the scope of the present invention is not limited to the above-described embodiments. Further, other micro- or nano-electrode vacuum tube structures such as tetrodes (FIG. 10C) and pentodes (FIG. 11C) can be formed by modifying the aforementioned process for fabricating a triode. The tetrode structure consists of a CNT grid that has been stiffened as described above. By applying a dielectric layer, a metal layer and then another suspended CNT fabric layer, a $4^{th}$-Terminal is constructed that is connected to a voltage source. This $4^{th}$-Terminal is called a screen and it further perturbs the electron current, giving an I-V curve similar to a silicon transistor; however, with a current dip in the reading. The other vacuum tube technology that can be fabricated with a rigid, porous non-woven fabric is the pentode. For the pentode 5th-terminal of 3rd rigid nanotube fabric is formed which is called a suppressor electrode. This terminal further modulates the current to give a representative transistor I-V curve. Structures such as tetrodes and pentodes can be formed by simply repeating the formation of alternating conducting and insulating layers such that the desired multi-electrode structure is formed. In addition, although the aforementioned processes were described using aforementioned conductive media, any conductive medium which has the capability of growing a high integrity insulating oxide, may be used in place of those listed.

Figure 10A:
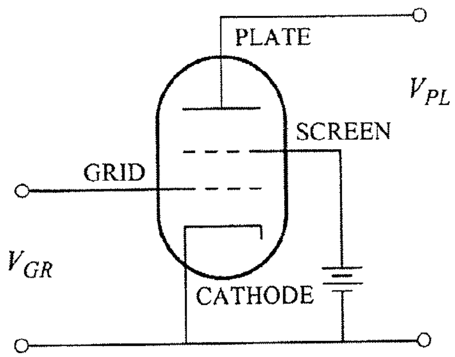
FIG. 10A illustrates a schematic of a conventional tetrode device.
Figure 10B:
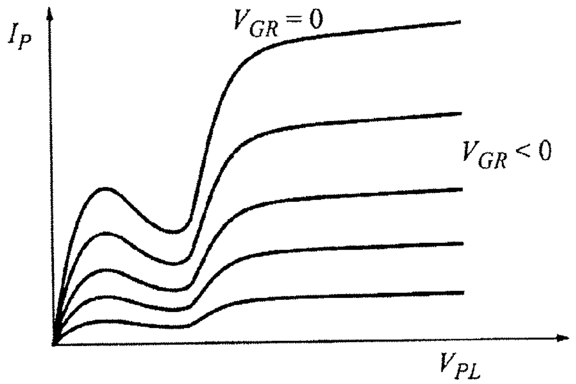
FIG. 10B is an IV curve typical for a device illustrated in FIG. 10A.
Figure 10C:
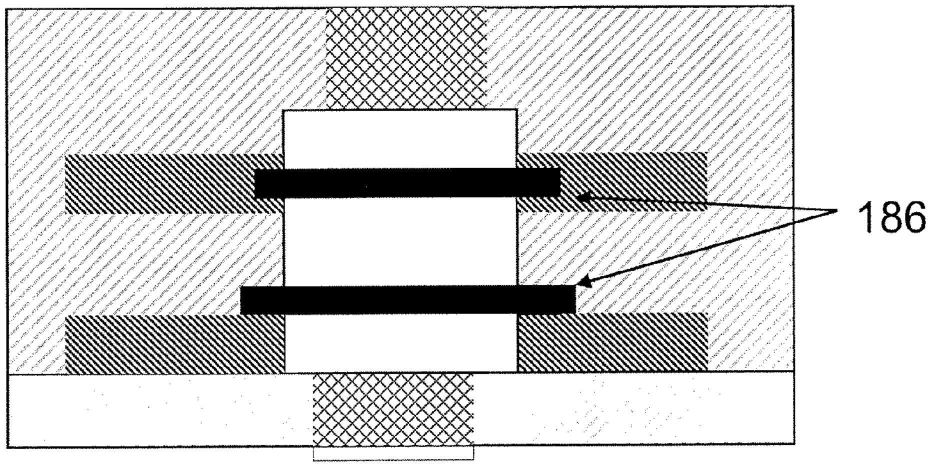
FIG. 10C illustrates an exemplary tetrode according to another aspect of the present invention.
Figure 11A:
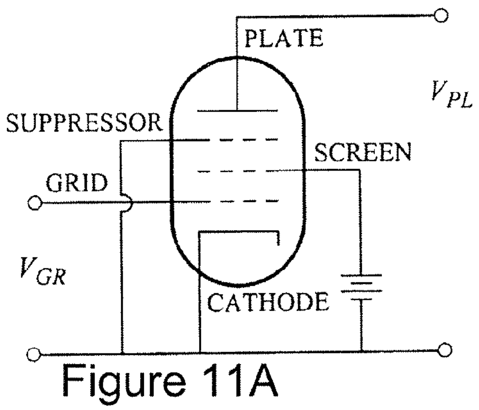
FIG. 11A illustrates a schematic of a conventional pentode device.
Figure 11B:
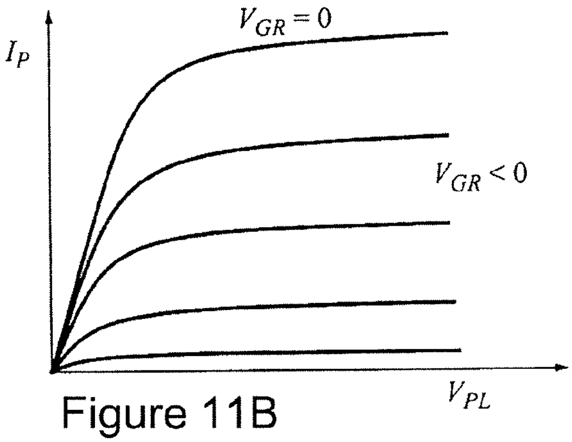
FIG. 11B is an IV curve typical for a device illustrated in FIG. 11A.
Figure 11C:
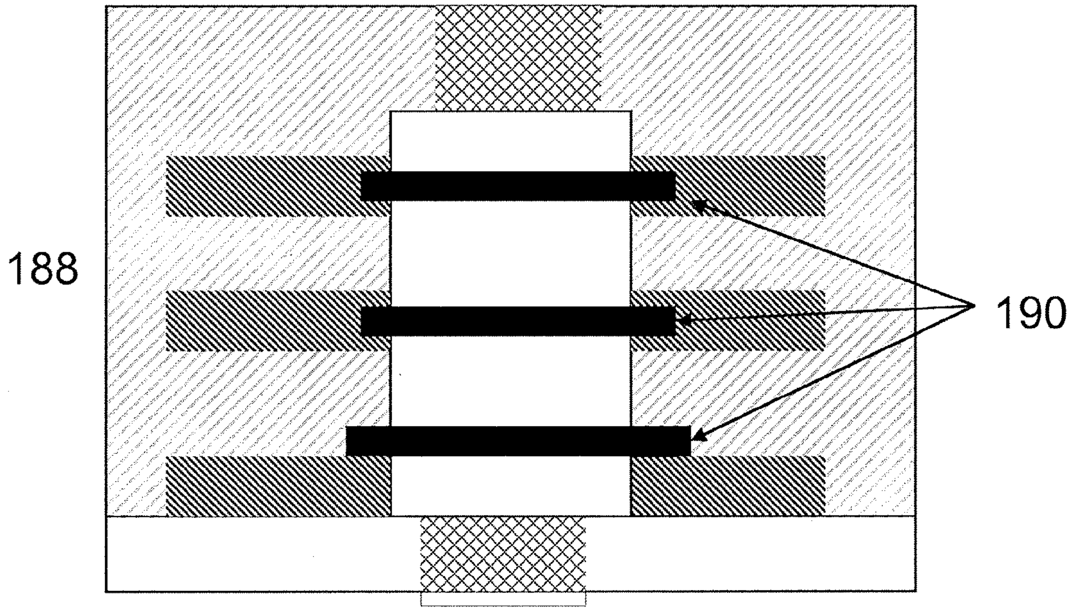
FIG. 11C illustrates an exemplary pentode according to another aspect of the present invention.

FIGS. 10A and 11A illustrate a conventional tetrode structure and pentode structure respectively. FIGS. 10B and 11B illustrate IV curves for typical tetrodes and pentodes, respectively. Structure 184, having grids 186 is shown in FIG. 10C. Structure 188, having grids 190 is shown in FIG. 11C. The grid type structures can manipulate the plate current to resemble the I-V characteristics of a semiconductor MOSFET device as described above in reference to FIG. 1'.

Various methods may be employed to fabricate non-horizontally disposed triodes that utilize carbon nanotube fabrics. Cross-sectional FIGS. 12A-L, collectively, illustrate an exemplary method of fabricating a substantially vertical triode structure. By vertical it is meant that the triode is substantially perpendicular to the major surface of the substrate. This aspect will be illustrated and described in detail below. Certain advantages can be realized in manufacturing such device using conformal nanotube and/or nanofabric materials (structure 1300 of FIG. 13). FIG. 13 displays carbon nanotube fabric 1310 conformally disposed at vertical profile region 1320. As a result, the length of the nanofabric article can be reduced in some embodiments by about two orders of magnitude. Additionally, the electrical resistance of a current-carrying nanofabric article is substantially reduced when the length of the article is reduced, as described herein.

Figure 12A:
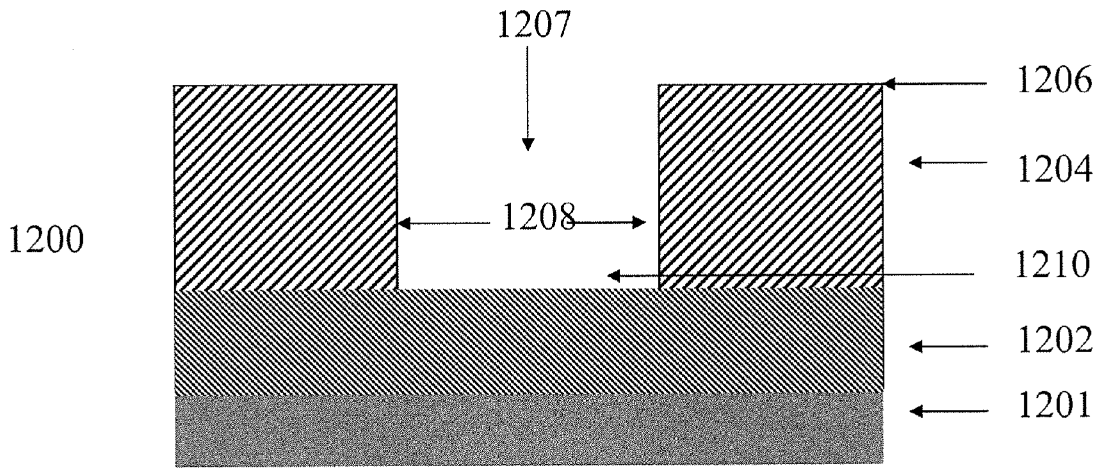
Figure 13:
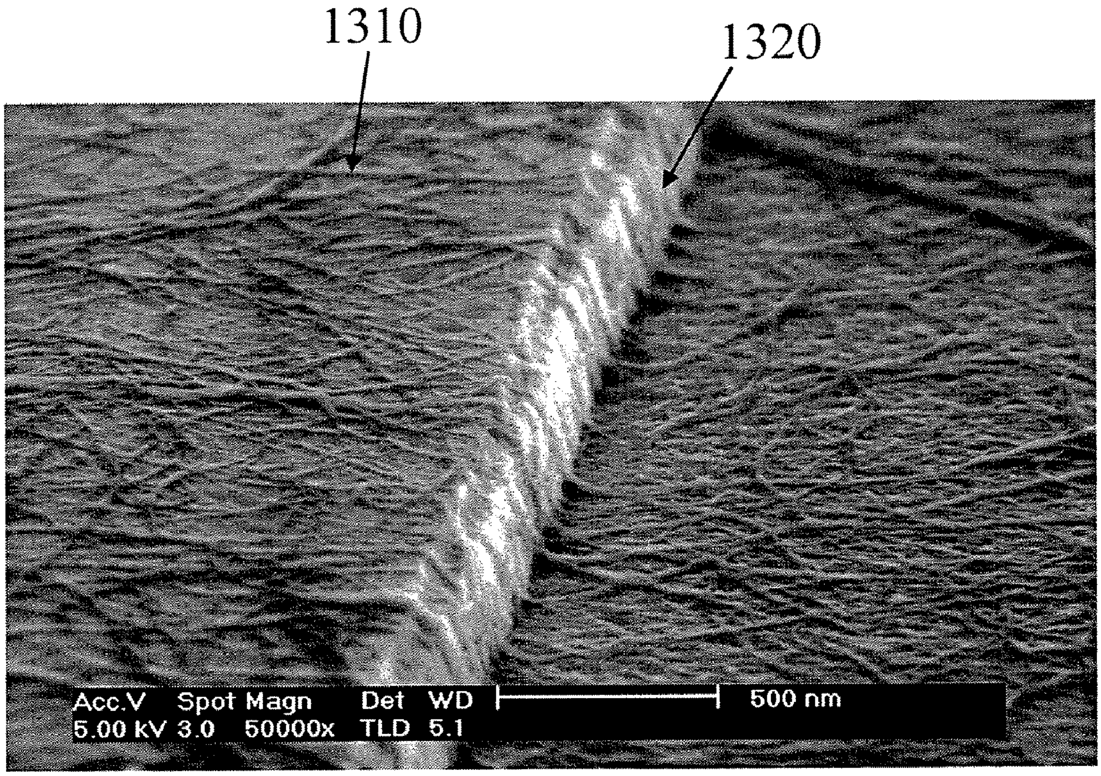
FIG. 13 illustrates an FESEM image of a conformal nanotube fabric on a vertically side-walled substrate, according to one embodiment of the invention.

In FIG. 12A, a semiconductor substrate 1201 may be coated with an insulating layer 1202 such as, but not limited to, silicon dioxide or silicon nitride. The insulating layer 1202 is preferably a few nanometers in thickness but could be as much 1 μm thick, depending upon the electrical characteristics desired for different applications. A second layer 1204 is deposited on insulating layer 1202. Two non-exclusive examples of the material the second layer 1204 can be made from are metals and semiconductors. The second layer has a top surface 1206. A cavity 1207 is formed in the second layer 1204. The cavity 1207 can be created by reactive ion etching into the second layer 1204; the cavity 1207 is defined by inner walls 1208 and an exposed top insulator surface 1210 of insulating layer 1202. In certain embodiments, a portion of second layer 1204 remains such that the bottom of the cavity 1207 is conductive. Alternatively, an insulating layer 1202 could be provided to top surface 1206 which could be etched to generate a cavity. The cavity 1207 can be prefabricated as part of a trench or a via provided as part of preprocessing steps, e.g., as part of an overall integration scheme in generation of an electronic device.

Figure 12B:
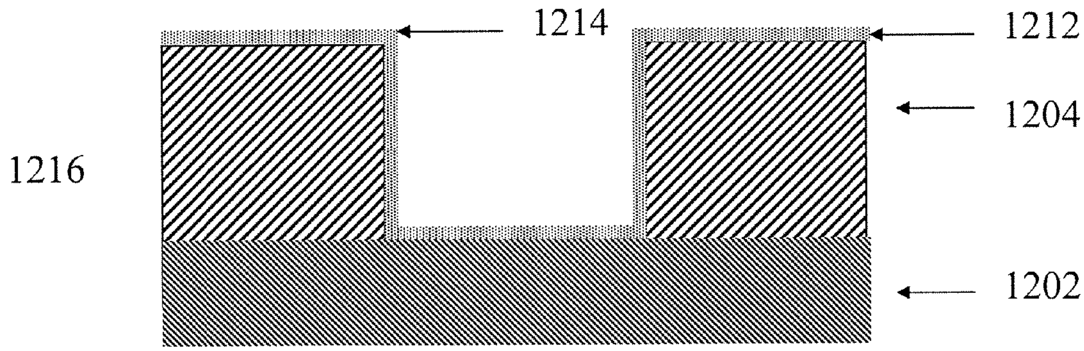

FIG. 12B illustrates a first insulating layer 1212 made of silicon nitride or other material deposited on top of the exposed top surface 1210 and top surface 1206 to generate top layer 1214 of intermediate structure 1216. The first insulating layer 1212 is selectively etched over poly-silicon, nanotubes and silicon oxide or other selected insulator. A first insulating layer 1212, which will act as a sacrificial layer to create a gap between subsequent layers, can be in a range of thicknesses described below as shown in intermediate structure 1216.

Figure 12C:
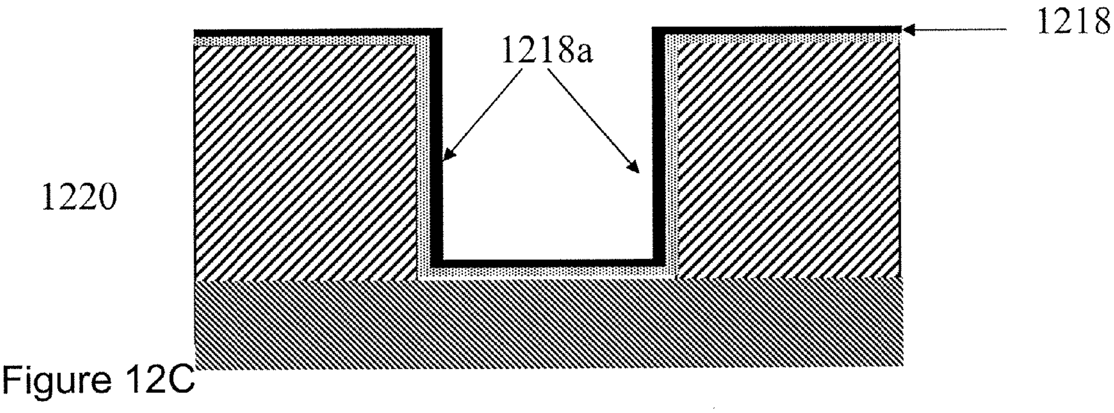

FIG. 12C illustrates a monolayer of nanofabric 1218 applied to intermediate structure 1216, forming intermediate structure 1220. The nanofabric 1218 may be applied by chemical vapor deposition, spin coating of suspensions of nanotubes, aerosolized nanotube suspensions or dipping into a solution of suspended nanotubes.

Nanofabric layer 1218 conforms to the underlying insulating layer 1212 and substantially follows the geometry of cavity 1207. Examples of nanofabric articles and methods of manufacturing and using the same can be found in the previously-mentioned and incorporated references. The resulting structure 1220 thus includes two vertical portions 1218*a* of the nanofabric 1218 which is perpendicular to the major surface of the substrate 1201.

It is at this time that the nanofabric 1218 may be stiffened (not shown) by using the techniques described above. The 'stiffening' of the nanofabric for the vertical device serves the same purpose as the horizontally disposed triode.

Figure 12D:
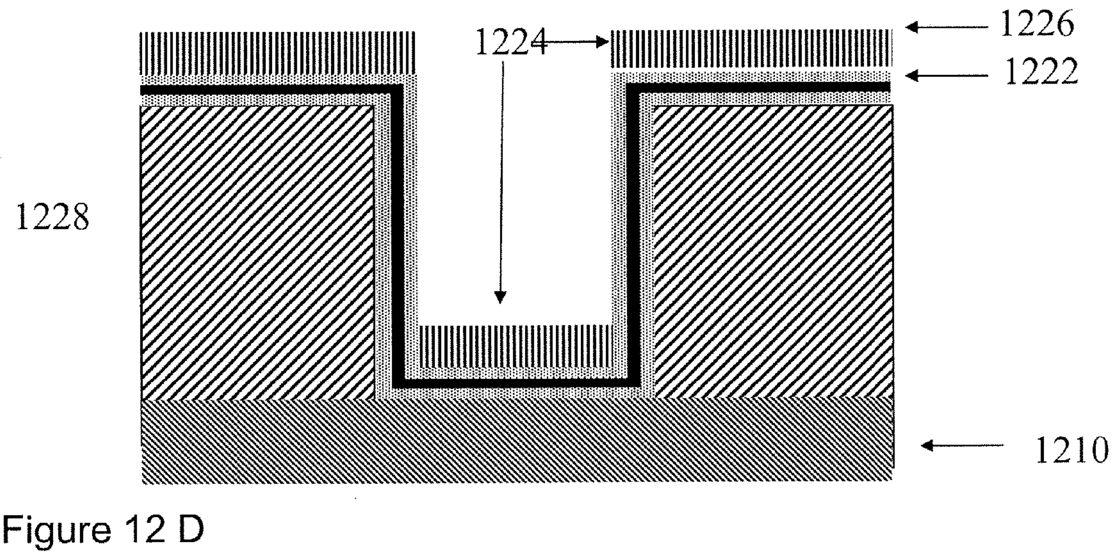

FIG. 12D illustrates a second insulating layer 1222 applied over nanofabric 1218. Protective insulating layer 1224 is deposited on top of second insulating layer 1222 having top surface 1226, forming intermediate structure 1228. The protective insulating layer 1224 is not deposited on the side walls of the channel. The thickness of protective insulating layer 1224 can be, for example, on the order of 100 nm, and a non-exclusive example of the method of application of protective insulating layer 1224, which may be an oxide layer, is by sputtering or high density plasma deposition of silicon dioxide. The optimal thickness is determined by the particular application to protect the layers below the insulating layer 1224 from additional etching or deposition steps.

Figure 12E:
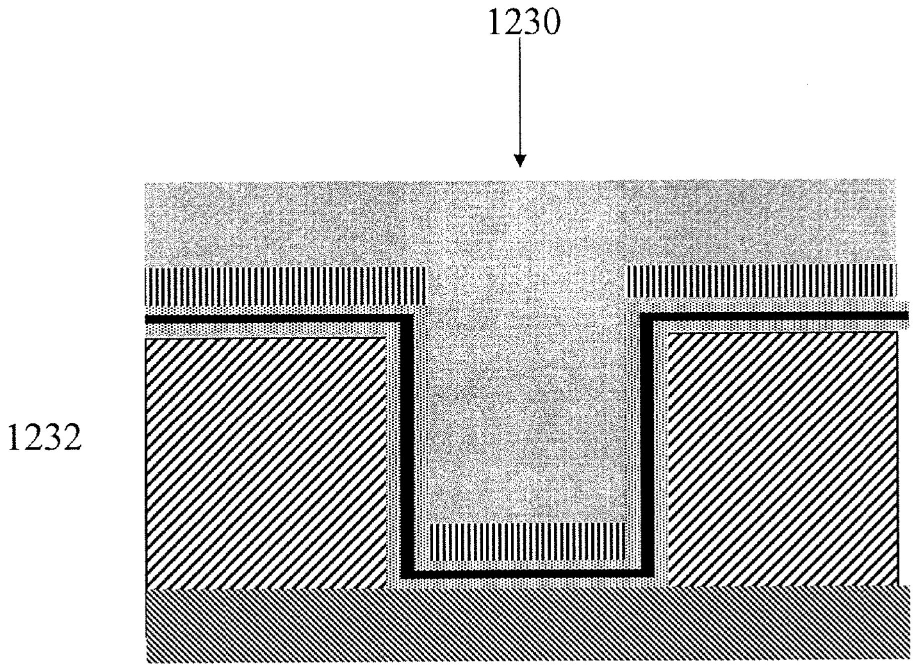
Figure 12F:
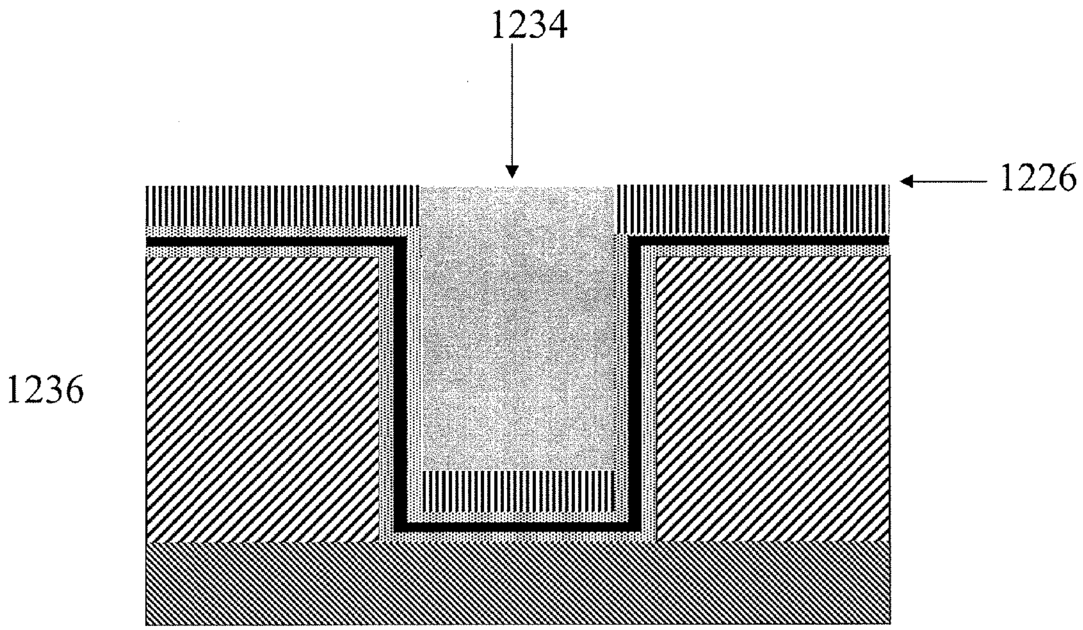

FIG. 12E illustrates a polysilicon layer 1230 deposited on top surface 1226 of intermediate structure 1228, filling the space between walls 1208 in cavity 1207. Polysilicon layer 1230 can be deposited to a height greater than that of top surface 1226. This allows the proper amount of polysilicon layer to be formed in cavity 1207, creating an overfilling condition as in intermediate structure 1232. Polysilicon layer 1230 is subsequently chemical-mechanical-planarized (CMP) to structure 1236, giving polysilicon plug 1234 with top surface 1226 of oxide layer 1224 (FIG. 12F).

Figure 12G:
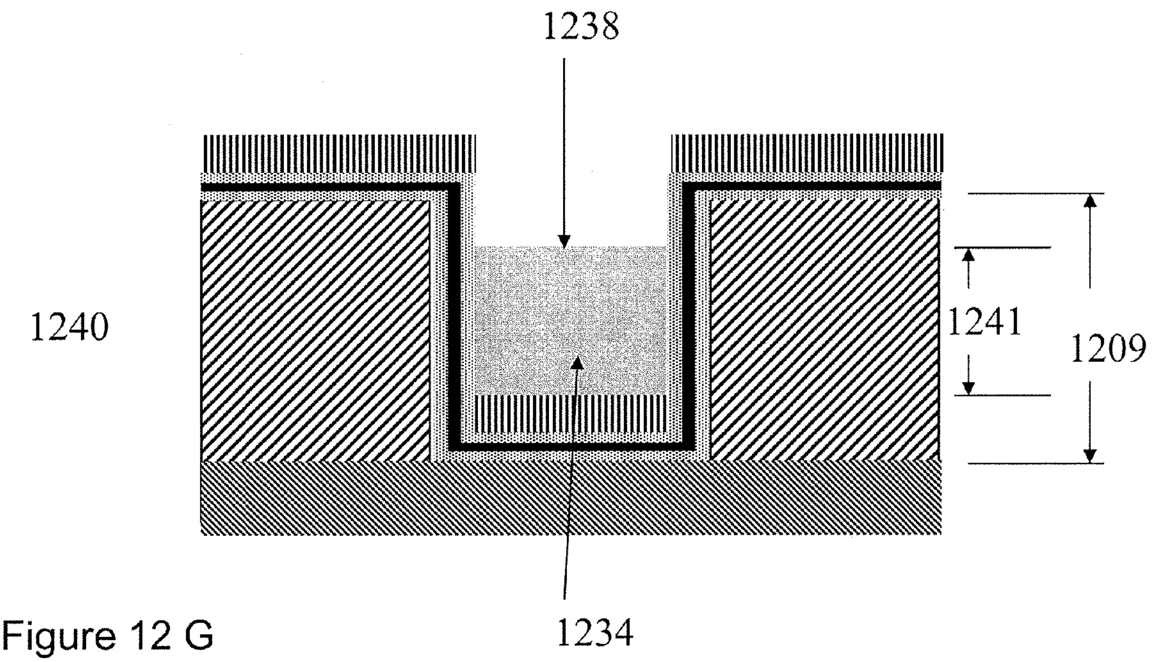
Figure 2H:
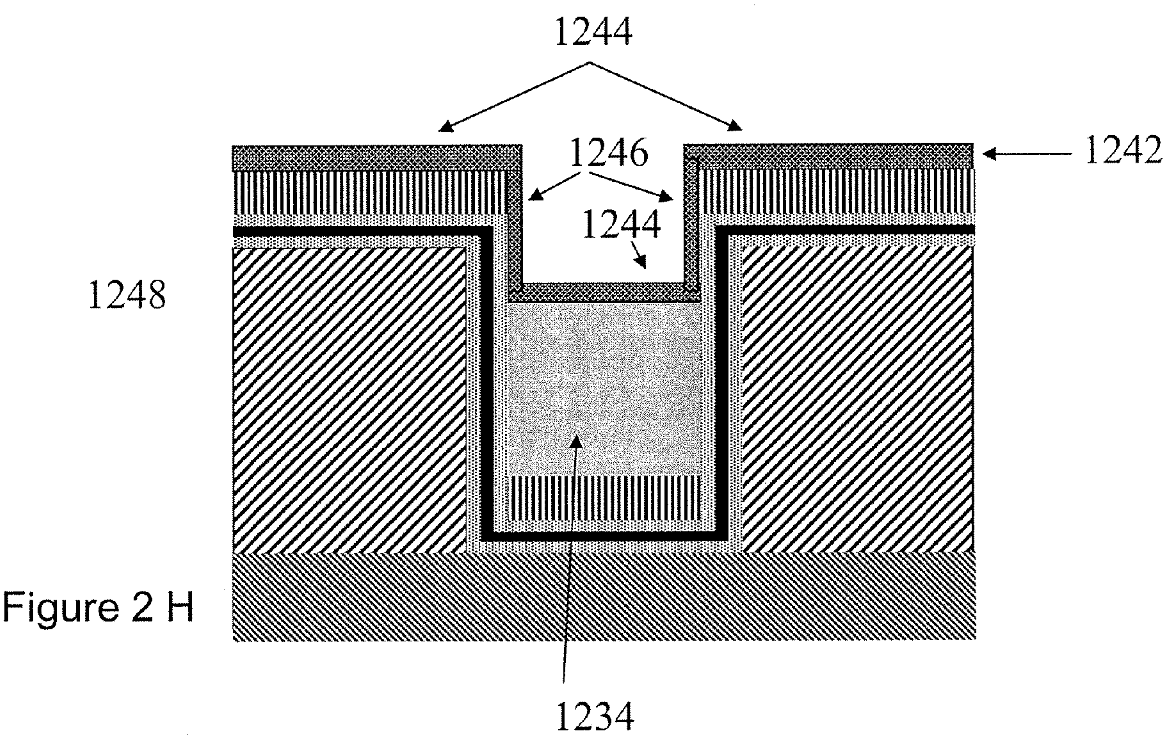

FIG. 12G illustrates polysilicon layer 1234 etched to a first depth 1238, by any appropriate method. An exemplary method of creating such a depth is by reactive ion etch (RIE) as shown in intermediate structure 1240; first depth 1238 later helps define one edge of a suspended nanofabric segment. The thickness 1241 of etched polysilicon layer 1234 is dependent on original trench depth 1209; for example the depth may be in a range from 200 nm to 1 micron and for applications requiring ultrahigh speed electromechanical switches, the depth will typically be below 200 nm. This depth can be reduced using thin film manufacturing techniques, as mentioned elsewhere in this document and in the documents incorporated by reference.

Figure 12I:
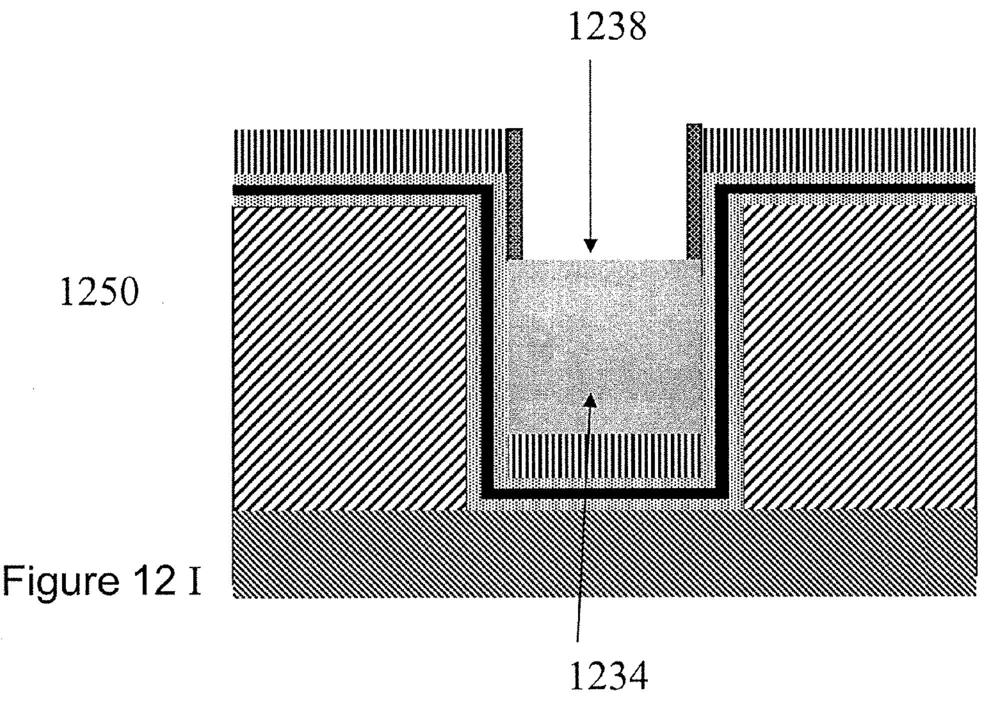

FIG. 12H illustrates a layer of oxide 1242 deposited on exposed surfaces of intermediate structure 1240. Horizontal portions 1244 of oxide layer cover trench walls and vertical oxide layers 1246 cover exposed, top surfaces of polysilicon layer 1234. Horizontal oxide layers 1244 are removed, e.g., by oxide spacer etching, leaving intermediate structure 1250 (FIG. 12I).

Figure 12J:
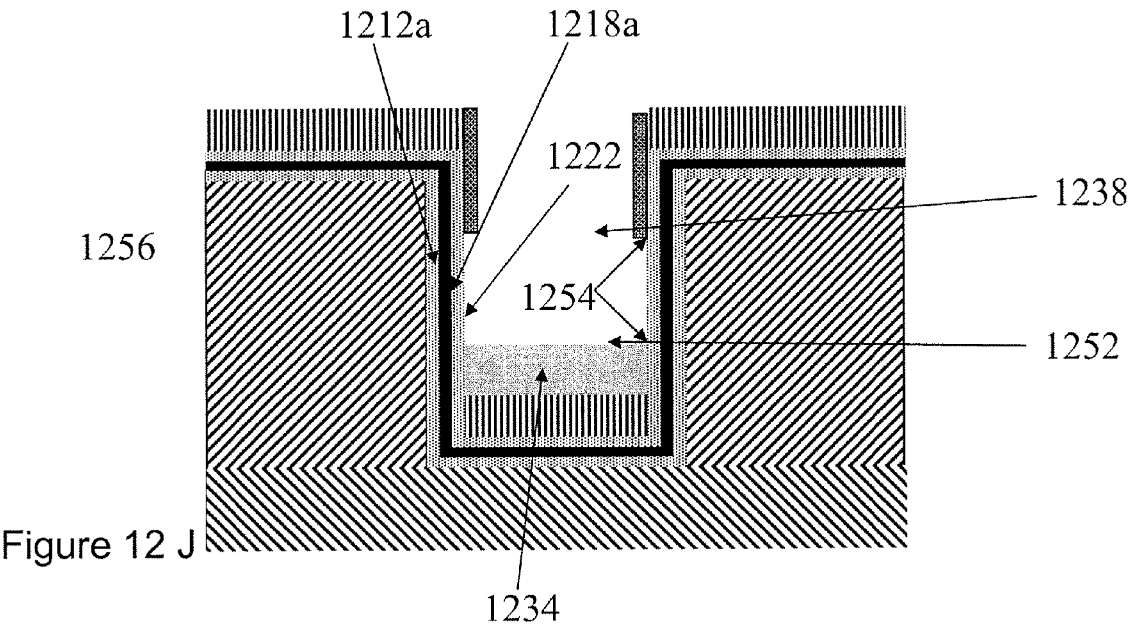

FIG. 12J illustrates polysilicon layer 1234 etched to a second depth 1252. Second depth 1252 may be approximately 50 nm deeper than first depth 1238. The defined gap 1254 allows exposure of regions of second insulating layer 1222 as is shown in intermediate structure 1256.

Since nanofabrics may be permeable or porous, the regions 1212*a* of first insulating layer 1212 below the regions of nanotube fabric 1218*a* are removable, e.g. by wet etching.

Figure 12K:
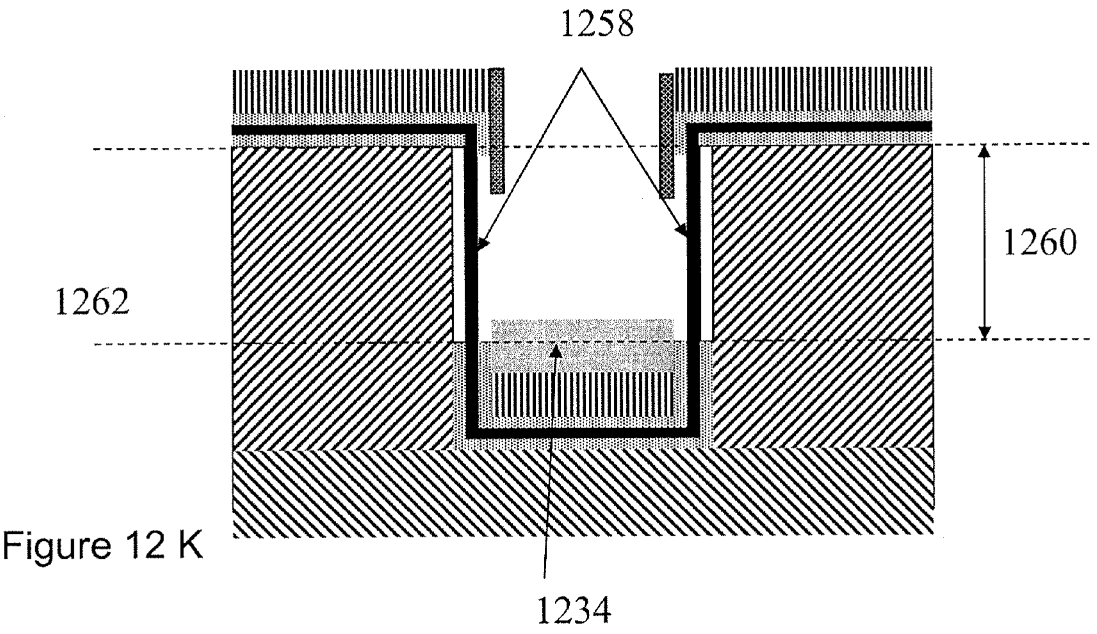

Suitable wet etching conditions to remove the layers of first insulating layer 1212 and second insulating layer 1222 leave a suspended nanofabric 1258 having vertical height 1260 as observed in intermediate structure 1262 (FIG. 12K). The wet etching may leave an overhang as a result of the nature of isotropic wet etching conditions.

The vertical height 1260 is defined by the etching procedure. For a vertical height 1260 of 200 nm the thicknesses of first insulating layer 1212 and second insulating layer 1222 would be approximately 20 nm in order to provide gap distances to create two non-volatile states. Smaller vertical gaps may be desirable in certain embodiments of the invention, e.g. 30 nm gap heights.

Figure 12L:
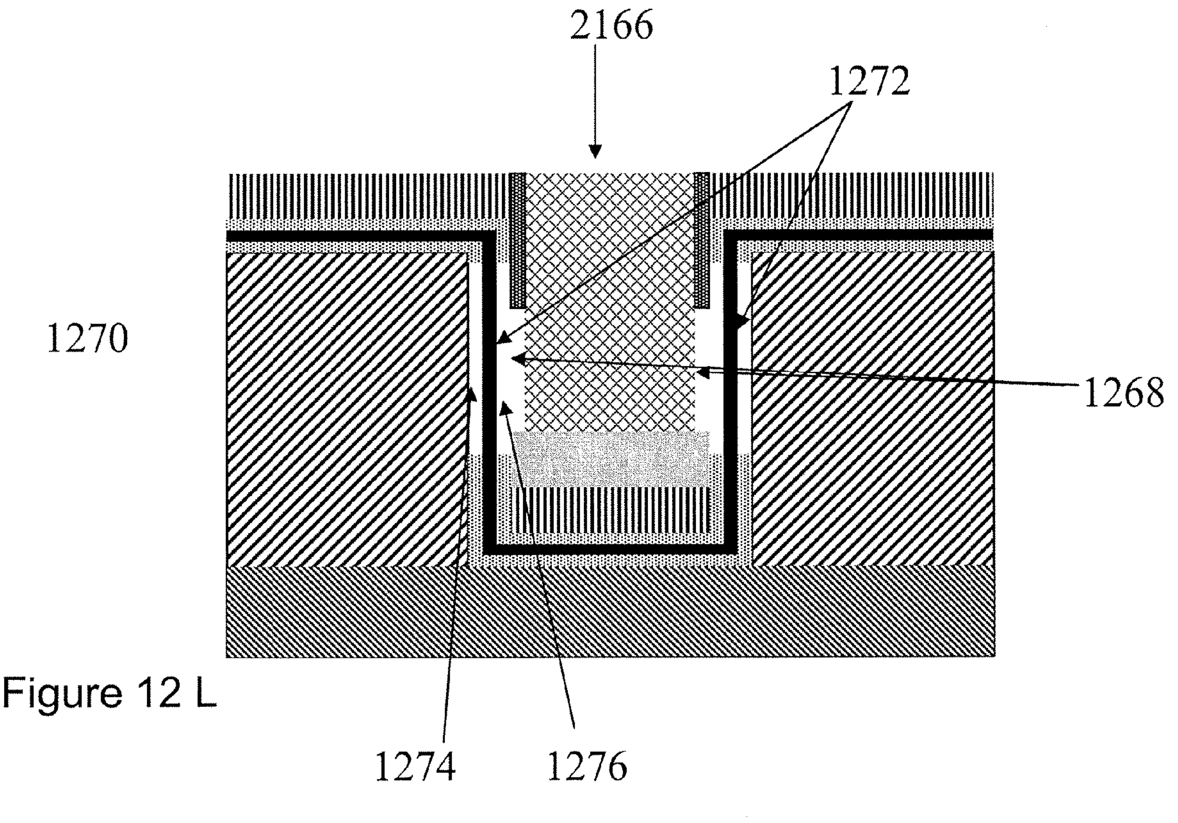

Electrode material 1266 is deposited into trench 1207, leaving gaps 1268 between electrode material 1266 and suspended nanotube fabric 1258 as shown in intermediate structure 1270 (FIG. 12L).

The structure 1270 illustrates a pair of vertically-suspended nanofabric portions 1272 surrounded by vertical gaps 1274, 1276 on either side of each portion. The structure may serve as a basis for a pair of vertically disposed triodes.

Similar to the horizontally disposed triodes, tetrodes and pentodes may be fabricated using fabrication techniques similar to those described above.

Other process and designs for a vertically disposed nanoelectronic device using a conformal nanotube fabric have can be envisioned and have been explained in U.S. Pat. No. 6,924,538, entitled Electro-Mechanical Switches and Memory Cells Using Vertically-Disposed Nanofabric Articles and Methods of Making the Same, filed on Feb. 11, 2004, the entire contents of which are incorporated in their entirety.

The invention may be embodied in other specific forms without departing from the spirit or essential characteristics thereof. The present embodiments are therefore to be considered in respects as illustrative and not restrictive.

The following commonly-owned patent references are assigned to the assignee of this application and are hereby incorporated by references in their entireties:

U.S. Pat. No. 6,919,592, entitled Electromechanical Memory Array Using Nanotube Ribbons and Method for Making Same, filed Jul. 25, 2001 [NAN1];

U.S. Pat. No. 6,643,165, entitled Electromechanical Memory Having Cell Selection Circuitry Constructed with Nanotube Technology, filed Jul. 25, 2001 [NAN2];

U.S. Pat. No. 6,574,130, entitled Hybrid Circuit Having Nanotube Electromechanical Memory, filed Jul. 25, 2001 [NAN3];

U.S. Pat. No. 6,911,682, entitled Electromechanical Three-Trace Junction Devices, filed Dec. 28, 2001 [NAN4];

U.S. Pat. No. 6,784,028, Methods of Making Electromechanical Three-Trace Junction Devices, filed Dec. 28, 2001 [NAN5];

U.S. Pat. No. 6,706,402, entitled Nanotube Films and Articles, filed Apr. 23, 2002 [NAN6];

U.S. Pat. No. 6,835,591 entitled Methods Of Nanotube Films And Articles, filed Apr. 23, 2002 [NAN7];

U.S. Pat. No. 6,759,693, entitled Nanotube Permeable Base Transistor, filed Jun. 19, 2002 [NAN8];

U.S. patent application Ser. No. 10/341,005, entitled, Methods Of Making Carbon Nanotube Films, Layers, Fabrics, Ribbons, Elements And Articles, filed Jan. 13, 2003 [NAN 15];

U.S. patent application Ser. No. 10/341,055, entitled Methods Of Using Thin Metal Layers To Make Carbon Nanotube Films, Layers, Fabrics, Ribbons, Elements And Articles, filed Jan. 13, 2003 [NAN16];

U.S. patent application Ser. No. 10/341,054, entitled Methods Of Using Pre-Formed Nanotubes To Make Carbon Nanotube Films, Layers, Fabrics, Ribbons, Elements And Articles, filed Jan. 13, 2003 [NAN 17];

U.S. patent application Ser. No. 10/341,130, entitled Carbon Nanotube Films, Layers, Fabrics, Ribbons, Elements And Articles, filed Jan. 13, 2003 [NAN18];

U.S. Pat. No. 6,924,538, entitled Electro-Mechanical Switches and Memory Cells Using Vertically-Disposed Nanofabric Articles and Methods of Making the Same, filed on Feb. 11, 2004 [NAN20];

U.S. Pat. Pub. No. 2005/0053525, entitled Horizontally-Oriented Sensor Constructed with Nanotube Technology, filed May 12, 2004 [NAN 29];

U.S. Pat. Pub. No. 2005/0065741, entitled Vertically-Oriented Sensor Constructed with Nanotube Technology, filed May 12, 2004 [NAN 30];

U.S. Patent Pub. No. 2005/0128788, entitled Patterned Nanoscopic Articles and Methods of Making the Same, filed Sep. 8, 2004 [NAN38]; and U.S. patent application Ser. No. 60/775,461, entitled Methods of Forming Nanotube Based Contacts to Semiconductor, filed Feb. 21, 2007 [NAN 111].

What is claimed is:

1. A multi-terminal vacuum field emission device comprising:

two substrates disposed at a predetermined gap and which define a space therebetween;

spacers positioned between the two substrates to vacuum seal the space formed by the two substrates while maintaining the gap;

a top electrode and a bottom electrode, arranged in proximity to the two substrates, the top electrode comprising an electron emission source;

a gate region of nanotube fabric disposed between the top electrode and the bottom electrode, the nanotube fabric being electrically insulated from the top electrode and the bottom electrode, and a gate terminal in electrical communication with the nanotube fabric;

wherein in response to an electrical stimulus on the gate terminal, the gate region of nanotube fabric induces emission of electrons from the electron emission source to form an electrically conductive pathway between the top and bottom electrodes.

2. The device of claim 1, comprising a triode, wherein the top electrode comprises an emitter and the bottom electrode comprises a collector.

3. The device of claim 1, further comprising a second patterned region of nanotube fabric disposed in a plane substantially parallel to and in spaced relation to the gate region of nanotube fabric, the second patterned region disposed between the top and bottom electrodes and in electrical communication with a corresponding terminal to receive electrical stimulus.

4. The device of claim 3, comprising a tetrode.

5. The device of claim 3, further comprising a third patterned region of nanotube fabric disposed in a plane substantially parallel to and in space relation to the gate region of nanotube fabric, the third patterned region disposed between the top and bottom electrodes and in electrical communication with a corresponding terminal to receive electrical stimulus.

6. The device of claim 5, comprising a pentode.

7. The device of claim 1, integrated in a CMOS circuit.

8. The device of claim 1, wherein the electrical stimulus comprises a relatively small voltage signal and wherein the controllable electrically conductive pathway is sensitive to the relatively small electrical voltage signal.

9. The device of claim 1, wherein the nanotube fabric comprises a mesh grid structure.

10. The device of claim 1, wherein the nanotube fabric comprises a substantially porous layer.

11. The device of claim 1, wherein the nanotube fabric comprises a plurality of unaligned nanotubes forming a network of conductive pathways.

12. The device of claim 1, wherein the plurality of nanotubes comprise metallic nanotubes.

13. The device of claim 11, wherein at least some of the nanotube are partially coated with a stiffening agent.

14. The device of claim 13, wherein the stiffening agent comprises a dielectric such that the mechanical characteristics of the nanotube fabric are substantially affected by the stiffening agent and such that the electrical characteristics of the nanotube fabric are substantially unaffected by the stiffening agent.

15. The device of claim 1, wherein the nanotube fabric is at least partially coated with a silicon-based material.

16. The device of claim 1, wherein the nanotube fabric is at least partially coated with a metal.

17. The device of claim 11, wherein the unaligned nanotubes substantially form a monolayer.

18. The device of claim 11, wherein the unaligned nanotubes form a multi-layered fabric.

19. The device of claim 1, wherein the bottom electrode comprises a layer of nanotube fabric.

20. The device of claim 1, wherein the top electrode comprises a layer of nanotube fabric.

21. The device of claim 1, wherein the bottom electrode and the top electrode each comprises a metal.

22. The device of claim 1, wherein the patterned region of nanotube fabric is selectively deformed from a planar orientation to alter a capacitance state between the top electrode and the bottom electrode.

23. The device of claim 19, wherein the bottom electrode comprising a layer of nanotube fabric is arranged along a plane substantially parallel to the plane of the grid.

24. The device of claim 19, wherein the bottom electrode is suspended in spaced relation to a surface of the two substrates.

25. The device of claim 24, wherein the bottom electrode is substantially mechanically deformed to alter a capacitance value between the gate region and the bottom electrode.

26. The device of claim 1, wherein the bottom electrode is conformally disposed on one surface of the two substrates.

27. The device of claim 1, wherein the top electrode is conformally disposed on one surface of the two substrates.

* * * * *